US006937107B2

(12) United States Patent
Ravi et al.

(10) Patent No.: US 6,937,107 B2
(45) Date of Patent: Aug. 30, 2005

(54) DEVICE AND METHOD OF QUADRATURE OSCILLATION

(75) Inventors: Ashoke Ravi, Hillsboro, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 10/608,549

(22) Filed: Jun. 30, 2003

(65) Prior Publication Data

US 2004/0263262 A1 Dec. 30, 2004

(51) Int. Cl.[7] .............................................. H03B 25/00
(52) U.S. Cl. ......................................... 331/47; 331/50
(58) Field of Search ............................. 331/46–48, 50, 331/52, 53, 56

(56) References Cited

U.S. PATENT DOCUMENTS

| 3,832,713 | A | * | 8/1974 | Rubin ........................ 342/371 |
| 5,717,730 | A | * | 2/1998 | Prakash et al. ............. 375/376 |
| 6,175,285 | B1 |  | 1/2001 | Gabara |
| 6,239,755 | B1 | * | 5/2001 | Klemens et al. ............ 343/702 |
| 6,404,288 | B1 | * | 6/2002 | Bletz et al. ..................... 331/2 |
| 6,462,626 | B1 | * | 10/2002 | Gharpurey .............. 331/108 B |
| 6,538,516 | B2 | * | 3/2003 | Lenk ............................. 331/2 |

OTHER PUBLICATIONS

U.S. Appl. No. 10/608,128, filed Jun. 30, 2003, Ravi et al.
U.S. Appl. No. 10/608,142, filed Jun. 30, 2003, Ravi et al.
U.S. Appl. No. 10/608,554, filed Jun. 30, 2003, Ravi et al.
U.S. Appl. No. 10/401,024, filed Jun. 30, 2003, Ravi et al.
A. Ravi et al., "An Integrated 10/5GHz Injection–locked Quadrature LC VCO in a 0.18$\mu$m digital CMOS process", European Solid State Research Conference (ESSCIRC), Sep. 26, 2002, pp. 1–4.

* cited by examiner

*Primary Examiner*—Joseph Chang
(74) *Attorney, Agent, or Firm*—Pearl Cohen Zedek Latzer, LLP

(57) ABSTRACT

Briefly, devices and methods for tuning of quadrature oscillators which may be used, for example, in a Complementary Metal-Oxide Semiconductor (CMOS) process. Devices and methods in accordance with some exemplary embodiments of the invention may allow, for example, improved locking, tuning and performance of slave oscillators and a master oscillator within a quadrature oscillator utilizing injection-locking.

9 Claims, 16 Drawing Sheets

_US 6,937,107 B2_

DEVICE AND METHOD OF QUADRATURE OSCILLATION

BACKGROUND OF THE INVENTION

Radio frequency (RF) transceivers may use quadrature modulation for higher spectral efficiency. The quadrature signals that are used for modulation and demodulation directly affect the performance of the transceiver and thus it is desirable that the quadrature signals be precise and have a low phase noise. Consequently, these signals may be generated locally at the transceiver.

Generating precise, high-quality, low phase-noise quadrature signals with a phase-shift of $\pi/2$ may be very difficult. In some conventional oscillators, two signals having a frequency $2f_0$ are generated with a phase difference of $\pi$. This phase difference may be produced precisely and straightforwardly, since the two signals have exact opposite phases. Two or more digital frequency dividers may be used to convert the two $2f_0$ signals into two signals of frequency $f_0$, respectively, with a phase difference of $\pi/2$.

Unfortunately, digital frequency dividers are high bandwidth devices, and consequently, the quadrature signals at their output may introduce undesired phase noise and other artifacts into the signal ultimately used for modulation and/or demodulation.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanied drawings in which:

Figure 1:
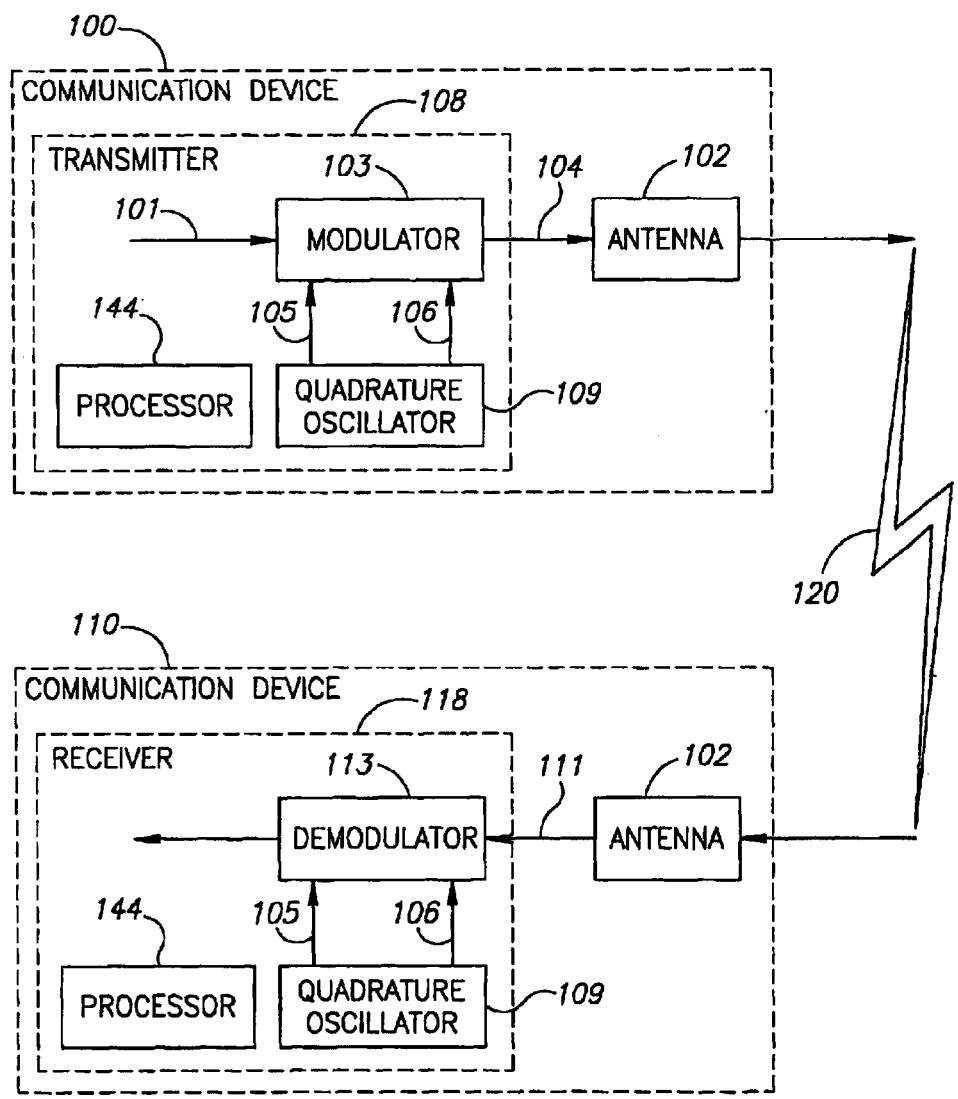
FIG. 1 is a simplified block-diagram illustration of an exemplary communication system, in accordance with some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, units and/or circuits have not been described in detail so as not to obscure the invention.

It should be understood that embodiments of the invention may be used in a variety of applications. Although the invention is not limited in this respect, embodiments of the invention may be used in many apparatuses, for example, a transmitter, a receiver, a transceiver, a transmitter-receiver, and/or a wireless communication device. Wireless communication devices intended to be included within the scope of the invention include, by way of example only, cellular radio-telephone communication systems, cellular telephones, wireless telephones, cordless telephones, Wireless Local Area Networks (WLAN) and/or devices operating in accordance with the existing 802.11a, 802.11b, 802.11g, 802.11n and/or future versions of the above standards, Personal Area Networks (PAN), Wireless PAN (WPAN), units and/or devices which are part of the above WLAN and/or PAN and/or WPAN networks, one way and/or two-way radio communication systems, one-way pagers, two-way pagers, Personal Communication Systems (PCS) devices, a Portable Digital Assistant (PDA) device which incorporates a wireless communications device, and the like.

By way of example, types of cellular radio-telephone communication systems intended to be within the scope of the invention include, although not limited to, Direct Sequence—Code Division Multiple Access (DS-CDMA) cellular radio-telephone communication systems, Global System for Mobile Communications (GSM) cellular radio-telephone systems, North American Digital Cellular (NADC) cellular radiotelephone systems, Time Division Multiple Access (TDMA) systems, Extended-TDMA (E-TDMA) cellular radio-telephone systems, Wideband CDMA (WCDMA) systems, General Packet Radio Service (GPRS) systems, Enhanced Data for GSM Evolution (EDGE) systems, 3G systems, 3.5G systems, 4G systems, communication devices using various frequencies and/or range of frequencies for reception and/or transmission, communication devices using 2.4 Gigahertz frequency, communication devices using 5.2 Gigahertz frequency, communication devices using 24 Gigahertz frequency, communication devices using an Industrial Scientific Medical (ISM) band and/or several ISM bands, and other existing and/or future versions of the above.

It will be appreciated that the term "oscillator" as used herein may include, for example, an oscillator, an oscillator circuit, an oscillation circuit, an oscillation device, an oscillation unit, a device including an oscillation circuit, an oscillator tuning circuit, an oscillator tuning device, and/or any suitable circuit, circuitry, device and/or unit (or any suitable combination thereof) which may produce, provide, create, change, modify, tune and/or fine-tune oscillation.

It will be appreciated that the phrase "free-running frequency" of a circuit or part of a circuit as used herein may refer, for example, to a natural frequency and/or to a self-resonant frequency of the circuit or part of circuit.

FIG. 1 schematically illustrates a simplified block-diagram of an exemplary communication system, in accordance with some embodiments of the invention. A communication device 100 may be able to communicate with a communication device 110 over a communication channel 120. It will be appreciated by persons of ordinary skill in the art that a quadrature oscillator according to embodiments of the invention may be present in communication device 100 only or in communication device 110 only or in both communication devices 100 and 110. The following description is based on the example of both communication devices including a quadrature oscillator according to one or another of the embodiments of the invention, although the invention is not limited in this respect.

Although the invention is not limited in this respect, the system shown in FIG. 1 may be part of a cellular communication system, with one of communication devices 100, 110 being a base station and the other a mobile station or with both communication devices 100, 110 being mobile stations, a pager communication system, a personal digital assistant and a server, etc. Communication devices 100 and 110 may each include a Radio Frequency (RF) antenna 102, which may include, for example, a dipole antenna or any other suitable radio frequency antenna.

Communication devices 100 and 110 may each include a processor 144, which may include, for example, a Central Processing Unit (CPU), Digital Signals Processor (DSP), or any suitable processor or micro-processor.

Communication device 100 may include a transmitter 108 that may include a modulator 103 and a quadrature oscillator 109. Modulator 103 may modulate and upconvert a data signal 101 using quadrature signals 105 and 106 generated by quadrature oscillator 109 to produce an upconverted modulated data signal 104, which, after amplification by a power amplifier (not shown), may be transmitted by RF antenna 102 over communication channel 120.

Communication device 110 may include a receiver 118 that may include a demodulator 113 and a quadrature oscillator, referenced 109 to indicate that it may be similar to quadrature oscillator 109 of transmitter 108, although the invention is not limited in this respect. Receiver 118 may receive a modulated data signal 111 from communication channel 120 via RF antenna 102, which may be demodulated and downconverted by demodulator 113 using quadrature signals 105 and 106 generated by quadrature oscillator 109.

Oscillator 109 may include an oscillator and/or an oscillating circuit, for example, a quadrature oscillator in accordance with embodiments of the invention as described below, e.g., circuit 200 of FIG. 2, circuit 300 of FIG. 3, circuit 400 of FIG. 4, circuit 700 of FIG. 7, circuit 800 of FIG. 8, circuit 900 of FIG. 9, circuit 1000 of FIG. 10, circuit 1200 of FIG. 12, circuit 1300 of FIG. 13, circuit 1400 of FIG. 14, circuit 1500 of FIG. 15, and/or circuit 1600 of FIG. 16, all of which circuits are described in detail below.

It will be appreciated by persons of ordinary skill in the art that communication devices 100 and 110, and in particular transmitter 108 and receiver 118, may include additional and/or alternative components that are not shown in FIG. 1 so as not to obscure the invention. For example, in some embodiments, communication device 100 or 110 may include a transceiver or a transmitter-receiver unit, which may incorporate some or all of the functionalities of transmitter 108 and/or receiver 118.

Figure 2:
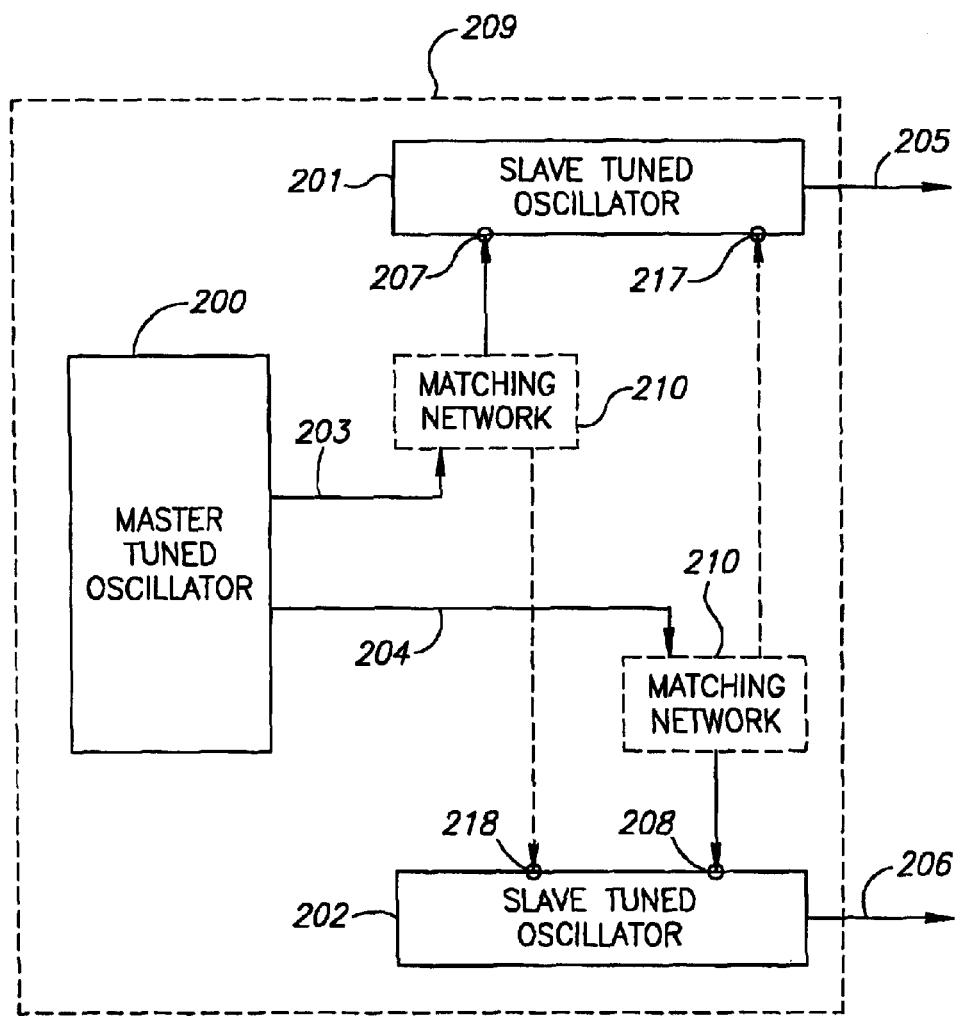
FIG. 2 is a simplified block-diagram illustration of an exemplary quadrature oscillator that may be used in conjunction with some embodiments of the present invention.

FIG. 2 schematically illustrates a simplified block-diagram of an exemplary quadrature oscillator 209 that may be used in conjunction with some embodiments of the invention. Quadrature oscillator 209 may include a master tuned-oscillator 200 and two slave tuned-oscillators 201 and 202. In addition, quadrature oscillator 209 may incorporate tuning circuits and/or methods (not shown in FIG. 2), as described in detail below with reference to FIGS. 3 to 19.

Master tuned-oscillator 200 may oscillate at a frequency $f_M$, which may be selectable from a range of frequencies, producing two signals, 203 and 204. Both signals may have a frequency $2f_0$ and a phase difference of $\pi$ radians therebetween.

Slave tuned-oscillators 201 and 202 may have free-running frequencies $f_{S1}$ and $f_{S2}$, respectively. Slave tuned-oscillator 201 (202) may include an input node 207 (208) having the property that when slave tuned-oscillator 201 (202) oscillates at its free-running frequency, only even harmonics of the free-running frequency can exist at this input node 207 (208). Slave tuned-oscillator 201 (202) may also include an optional input node 217 (218) having the property that when slave tuned-oscillator 201 (202) oscillates at its free-running frequency, only even harmonics of the free-running frequency can exist at this input node 217 (218). It will be appreciated by persons skilled in the art that the signal at input node 217 (218) may have a phase difference of $\pi$ radians from the signal at node 207 (208).

If a periodic signal having certain characteristics is injected into input node 207 (208), slave tuned-oscillator 201 (202) and its output signal 205 (206) may oscillate at half the frequency of the injected signal, which may be different from free-running frequency $f_{S1}$ ($f_{S2}$). Moreover, output signal 205 (206) may maintain phase relations with the signal injected at input node 207 (208).

If a periodic signal having certain characteristics is injected into input node 207 (208), and in addition, a periodic signal having similar characteristics and having a phase difference of π radians from the signal at node 207 (208) is injected into input node 217 (218), slave tuned-oscillator 201 (202) and its output signal 205 (206) may oscillate at half of the injection signal's frequency and not at its free-running frequency $f_{S1}$ ($f_{S2}$). This oscillation may be more immune to noise than the oscillation induced by having an injected signal only at one input node. Moreover, output signal 205 (206) may maintain phase relations with the signal injected at input node 207 (208). Consequently, a period of the signal at 205 (206) may contain two periods of the signal at input node 207 (208).

Signal 203, having a frequency of $2f_0$, may be injected into input node 207 of slave tuned-oscillator 201 through an optional matching network 210. If slave tuned-oscillator 201 is tuned to have its resonant frequency $f_{S1}$ sufficiently close, for example, within an injection-locking range, to $f_0$, and the amplitude of signal 203 is within an appropriate range, then slave tuned-oscillator 201 may oscillate at half of the frequency of signal 203, namely at $f_0$. Slave tuned-oscillator 201 may then generate output signal 205 at frequency $f_0$ and maintain a phase relation with signal 203. In other words, slave tuned-oscillator 201 is 'locked' to signal 203.

Similarly, signal 204, having a frequency of $2f_0$, may be injected into input node 208 of slave tuned-oscillator 202 through optional matching network 210. If slave tuned-oscillator 202 is tuned to have its free-running frequency $f_S2$ sufficiently close, for example, within an injection-locking range, to $f_0$, and the amplitude of signal 204 is within an appropriate range, then slave tuned-oscillator 202 may oscillate at half of the frequency of signal 204, namely at $f_0$. Slave tuned-oscillator 202 may then generate output signal 206 at frequency $f_0$ and maintain a phase relation with signal 204. In other words, slave tuned-oscillator 202 is 'locked' to signal 204.

In addition, signal 203 may be injected into node 218 of slave tuned-oscillator 202 through optional matching network 210, and signal 204 may be injected into node 217 of slave tuned-oscillator 201 through optional matching network 210.

Figure 3:
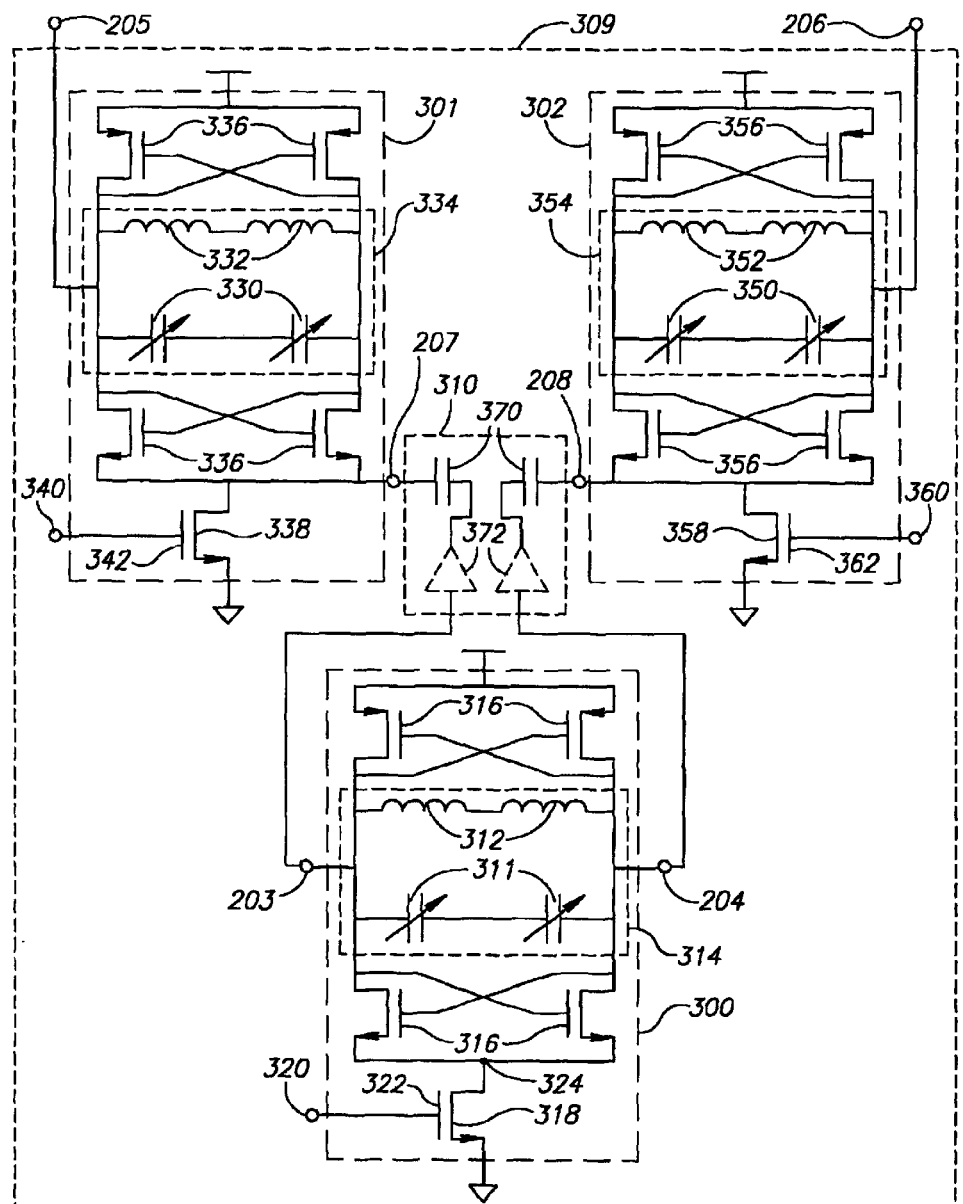
FIG. 3 is a schematic illustration of a quadrature oscillator in accordance with some embodiments of the invention.
Figure 4:
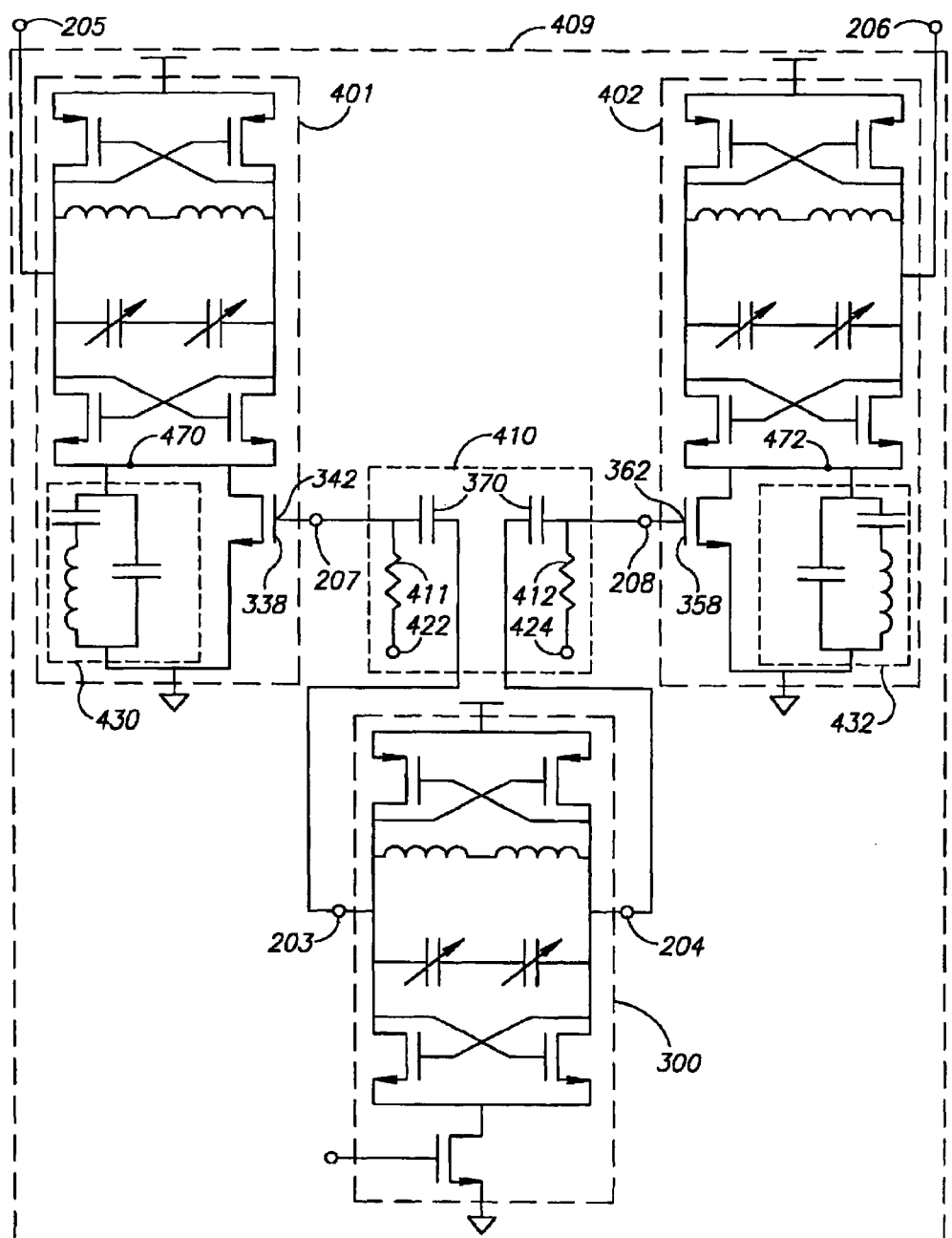
FIG. 4 is a schematic illustration of another a quadrature oscillator in accordance with some embodiments of the invention.

FIGS. 3 and 4 schematically illustrate two, respective, quadrature oscillators according to exemplary embodiments of the invention. These exemplary quadrature oscillators include exemplary embodiments of master tuned-oscillators and slave tuned-oscillators corresponding to the master tuned-oscillator and slave tuned-oscillators of FIG. 2.

In both FIGS. 3 and 4, a master tuned-oscillator may be coupled to slave tuned-oscillators with single-ended inputs, possibly using appropriate matching networks. It is noted that in other embodiments, a master tuned-oscillator may be coupled to slave tuned-oscillators with differential inputs.

The master tuned-oscillators illustrated in FIGS. 3 and 4 may be tuned to oscillate at $2f_0$ in order to generate output signals 203 and 204 oscillating at $2f_0$. In contrast, in other embodiments, output signals 203 and 204 may be generated at second-harmonic nodes, and the master tuned-oscillator may be tuned to oscillate at $f_0$ to produce output signals 203 and 204 oscillating at $2f_0$.

FIG. 3 schematically illustrates a quadrature oscillator 309, in accordance with some embodiments of the invention. Quadrature oscillator 309 may include a master tuned-oscillator 300 and slave tuned-oscillators 301 and 302, and may optionally include a matching network 310.

Master tuned-oscillator 300 may include two pairs of cross-coupled transistors 316, a tank 314, and a transistor 318. Tank 314 may include capacitors 311 and inductors 312 connected in parallel. The frequency, $f_M$, generated by master tuned-oscillator 300 may be determined by the properties of capacitors 311 and inductors 312. Inductors 312 may have a fixed inductance, while capacitors 311 may be variable and controlled for the purpose of tuning the frequency $f_M$. Cross-coupled transistors 316 may create a negative resistance path to cancel out any losses in tank 314. Transistor 318 may function as a tail current source, receiving a biasing signal 320 at its gate 322. A node 324 may have the property that only even harmonics of the frequency $f_M$ may exist at this node.

Frequency $f_M$ of master tuned-oscillator 300 may be tuned to be $2f_0$, namely, signals 203 and 204 may be of frequency $2f_0$.

Slave tuned-oscillator 301 (302) may include two pairs of cross-coupled transistors 336 (356), a tank 334 (354) and a transistor 338 (358). Tank 334 (354) may include capacitors 330 (350) and inductors 332 (352) connected in parallel. The free-running frequency $f_{S1}$ ($f_{S2}$) of slave tuned-oscillator 301 (302) may be determined by the properties of capacitors 330 (350) and inductors 332 (352). Inductors 332 (352) may have a fixed inductance, while capacitors 330 (350) may be variable and controlled for the purpose of tuning the free-running frequency $f_{S1}$ ($f_{S2}$). Cross-coupled transistors 336 (356) may create a negative resistance path to cancel out any losses in tank 334 (354). Transistor 338 (358) may be a tail current source receiving a biasing signal 340 (360) at its gate 342 (362). Free-running frequency $f_{S1}$ ($f_{S2}$) of slave tuned-oscillator 301 (302) may be tuned to be sufficiently close to $f_0$. Moreover, the signal injected at an input node 207 (208) may have the appropriate amplitude, and consequently slave tuned-oscillator 301 (302) may lock to the signal at input node 207 (208).

A single-ended connection scheme, an exemplary embodiment of which is shown by matching network 310, may be used to couple master tuned-oscillator 300 and slave tuned-oscillators 301 and 302. Matching network 310 may couple signal 203 to input node 207 and signal 204 to input node 208. Capacitors 370 of matching network 310 may block the direct current (DC) components and pass the alternate current (AC) components of signals 203 and 204. Although the invention is not limited in this respect, capacitors 370 may be Metal-Insulator-Metal (MiM) capacitors available as an add-on for Complementary-Metal-Oxide-Semiconductor (CMOS), vertical mesh Metal-Metal capacitors. Matching network 310 may optionally include buffers 372 coupled to capacitors 370 to minimize kickback of signals into master tuned-oscillator 300.

FIG. 4 schematically illustrates a quadrature oscillator 400, in accordance with some embodiments of the invention. Quadrature oscillator 400 may include master tuned-oscillator 400 and slave tuned-oscillators 401 and 402, and may optionally include a matching network 410.

Gate 342 (362) of tail current source transistor 338 (358) may be used at tuned oscillator 401 (402) as input node 207 (208). The amplitude of the signal at input node 207 (208) may be smaller than the minimum amplitude required to force slave tuned-oscillator 701 (702) to oscillate at $f_0$. (In this embodiment, the free-running frequency $f_M$ of master tuned-oscillator 300 may be tuned to be $2f_0$, namely, signals 203 and 204 may be of frequency $2f_0$.) Slave tuned-oscillator 401 (402) may therefore optionally include a shunt resonant circuit 430 (432), tuned to $2f_0$ frequency. Shunt resonant circuit 430 (432) may be coupled to a node 470 (472), matching the amplitude requirements of slave tuned-oscillator 401 (402) to the amplitude of the signal at input node 207 (208).

A single-ended connection scheme, an exemplary embodiment of which is shown by matching network 410, may be used to couple master tuned-oscillator 300 and slave tuned-oscillators 401 and 402. Matching network 410 including capacitors 370 may couple signal 203 to input node 207 and signal 204 to input node 208. In contrast with matching network 310 of FIG. 3, matching network 410 may not include buffers 372 since the input impedance of gates 342 and 362 may be high. Matching network 410 may include resistors 411 and 412 to inject DC biasing signals 422 and 424 to the gates 342 and 362 of tail current source transistors 338 and 358, respectively.

Exemplary embodiments of the invention, as described in detail below, provide circuits and methods for digital tuning to improve phase-noise rejection in an injection-locked tuned quadrature oscillator, for example, a Complementary Metal-Oxide Semiconductor (CMOS) quadrature oscillator.

Exemplary embodiments of an aspect of the invention, as described in detail below, provide circuits and methods of tuning the free-running frequency of first and second slave oscillators to enable locking of the slave oscillators to an injected frequency, $f_0$, which relates to a master oscillator frequency, for example, $2f_0$. The tuning may be based on a phase comparison between outputs of the first and second slave oscillators, both injected with the same master oscillator frequency.

Exemplary embodiments of another aspect of the invention, as described in detail below, provide circuits and methods of tuning the free-running frequencies of a slave oscillator to a desired injection frequency within a locking range based, on a comparison between the phase of an output of the slave oscillator and the phase of a signal related to the injected frequency.

Figure 5:
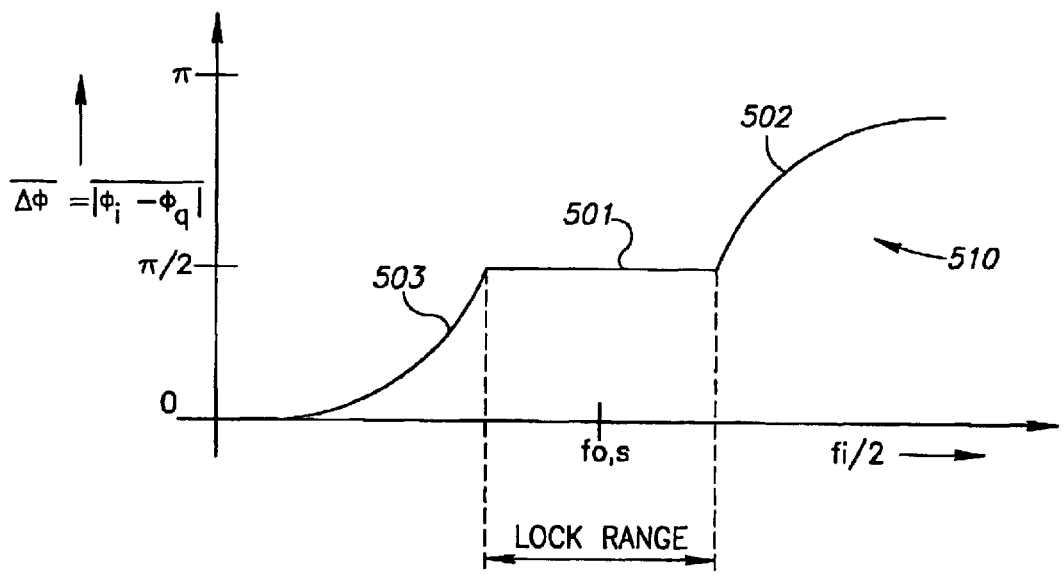
FIG. 5 is a schematic illustration of a graph depicting phase difference between the outputs of two slave oscillators as a function of frequency, demonstrating an aspect of exemplary embodiments of the invention.

FIG. 5 schematically illustrates a graph 510 depicting phase versus frequency of a slave oscillator, demonstrating some aspects of an exemplary embodiment of the invention. An oscillation circuit in accordance with an exemplary embodiment of the invention may include one or more slave oscillators receiving input signals, for example, from a master oscillator. The master oscillator may produce and/or provide a master in-phase (I) frequency $2f_0$ with phase θ, to be injected into a first slave oscillator, and a master quadrature (Q) frequency $2f_0$ with phase θ+π, to be injected into a second slave oscillator. It will be appreciated by persons skilled in the art that a conventional oscillator may be able to lock onto an injected frequency, $f_0$, within locking range 501 of graph 510; however, a conventional slave oscillator is unable to lock onto the injected frequency within peripheral ranges 502 and 503 of graph 510.

In accordance with exemplary embodiments of the invention, the free-running frequency of either or both the first and second slave oscillators may be tuned and/or modified, $f_0$r example, based on a property related to a difference in phase between the output of the first slave oscillator and the output of the second slave oscillator, to allow locking and/or improved locking onto the injected frequency.

In accordance with some embodiments of the invention, a phase difference between two slave oscillators may be used to detect a failure of the slave oscillators to injection lock. For example, output phases of slave oscillators are in quadrature only as long as the frequency of the master oscillator is within a finite lock range of the system. Outside the lock range, the output frequency of the slave oscillator may include a superimposition of the free-running frequency of the slave oscillators and a beat note component, which is the difference between $f_0$ (i.e., half the frequency of the injected signal) and the free-running frequency of the slave oscillators. Higher order harmonics of the beat note component may also be present in the output signal. In such case, the output phase difference between the two slave oscillators may vary from cycle to cycle, with an average value between 0 and π radians as illustrated schematically in graph 510.

Figure 6:
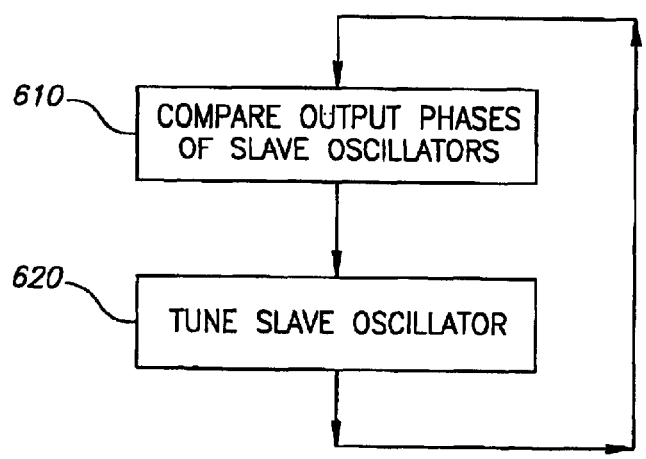
FIG. 6 is a flow chart diagram of a method of locking a frequency of a slave oscillator in accordance with exemplary embodiments of the invention.

FIG. 6 schematically illustrates a flow chart of a method of locking a slave oscillator in accordance with an exemplary embodiment of the invention. The method of FIG. 6 may be used, for example, in conjunction with circuit 200 of FIG. 2, circuit 300 of FIG. 3, circuit 400 of FIG. 4, circuit 700 of FIG. 7, circuit 800 of FIG. 8, circuit 900 of FIG. 9, circuit 1000 of FIG. 10, and/or other suitable circuits or devices in accordance with embodiments of the invention.

As indicated at block 610, a first output phase of a first slave oscillator may be compared to a second output phase of a second slave oscillator. In an exemplary embodiment, a value of a property indicating the output phase of the first slave oscillator may be compared to a value of a property indicating the output phase of the second slave oscillator. As indicated at block 620, the frequency of the first slave oscillator and/or the second slave oscillator may be tuned, adjusted and/or modified. In some embodiments, such tuning, adjustment and/or modification may be performed smoothly and/or continuously and/or substantially continuously, may be repeated, and/or may be performed in relation to the comparison and/or to a property of the comparison result.

In accordance with some embodiments of the invention, the phase difference between the two slave outputs may be detected, sensed, calculated and/or measured. This may be performed, for example, using an analog multiplier or digital Exclusive-OR (XOR) gates, or any other suitable components, as described below with reference to FIGS. 7 to 10.

FIGS. 7 to 10 schematically illustrate tuning circuits, which may be used, for example, in conjunction with the method of FIG. 6, in accordance with exemplary embodiments of the invention. In some embodiments, in the event of successful injection locking, the output of such phase-difference detection, after passing optional low-pass filtering, is at a mid-rail reference voltage of the circuit. The difference between the value of the filtered output voltage and the mid-rail reference voltage may be used as a tuning signal, for example, to adjust the free-running frequency of the slave oscillators.

Figure 7:
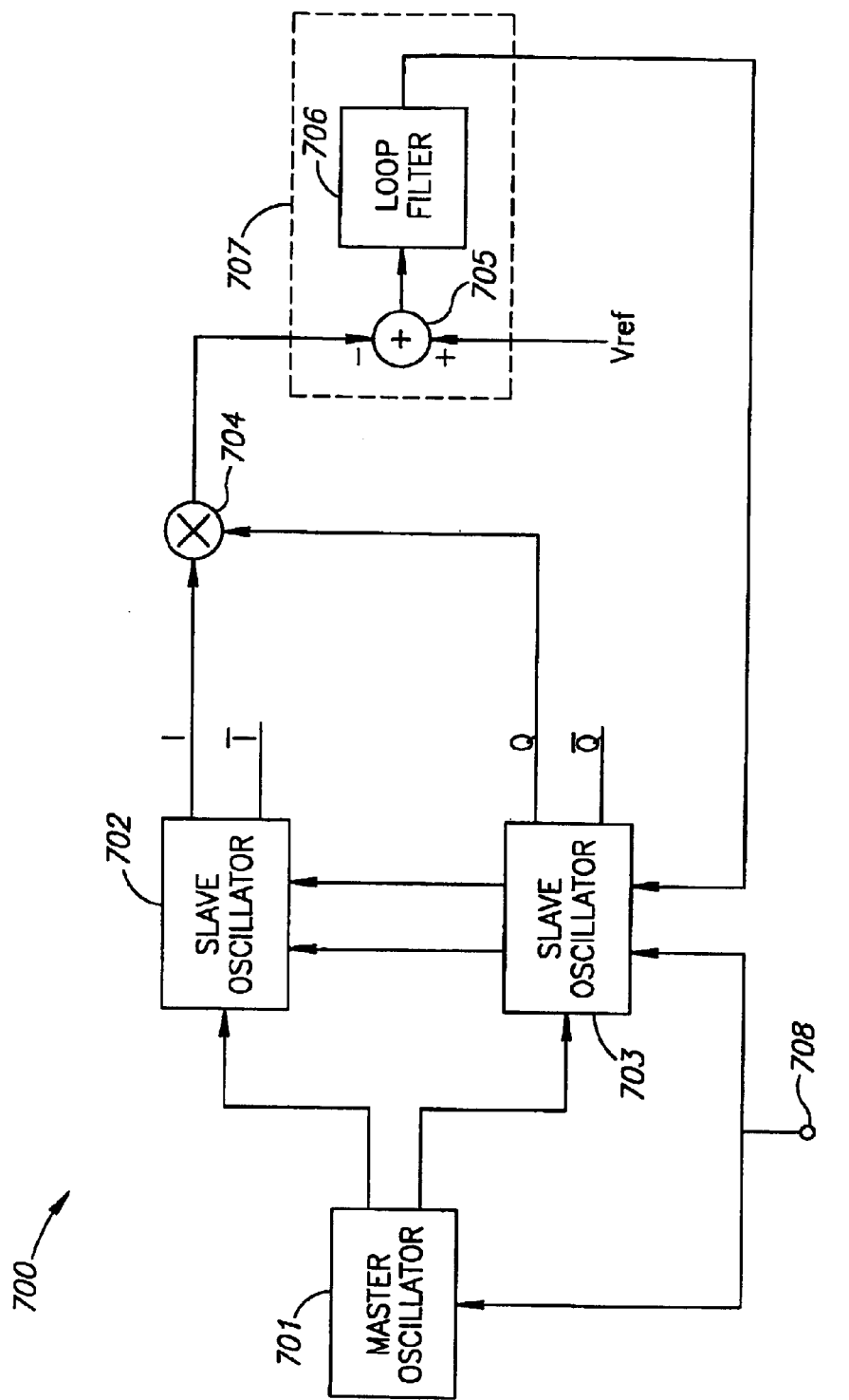
FIG. 7 is a schematic illustration of a tuning circuit with single-ended phase comparison in accordance with exemplary embodiments of the invention.

FIG. 7 schematically illustrates a tuning circuit 700 with single-ended phase comparison in accordance with an exemplary embodiment of the invention. Circuit 700 may include, for example, a master oscillator 701, two slave oscillators 702 and 703, a phase detector 704, a subtractor 705, a loop filter 706, and a timing control 708. These components may be arranged and/or connected, for example, as illustrated schematically in FIG. 7.

Phase detector 704 may include, for example, an analog multiplexer or a XOR gate. Subtractor 705 may include, for example, a subtractor unit or an adder unit, depending on specific implementations. In some embodiments, subtractor 705 and loop filter 706 may be implemented using one integrated unit 707.

During operation of circuit 700, master oscillator 701 may produce and/or provide a signal to each of slave oscillators 702 and 703. Tuning control 708 may be used to tune the frequencies of master oscillator 701, slave oscillator 702 and/or slave oscillator 703, for example, to bring frequencies of slave oscillator 702 and/or slave oscillator 703 sufficiently close to the frequency of master oscillator 701, such that circuit 700 may have sufficient gain to allow locking.

Phase detector 704 may receive an in-phase (I) output signal from slave oscillator 702 and a quadrature (Q) output signal from slave oscillator 703. Phase detector 704 may compare the phase difference of the I and Q signals, and may produce an output signal responsive to the comparison result. Subtractor 705 may subtract the output signal of phase detector 704 from a reference signal having a reference voltage. In an exemplary embodiment, the reference voltage may be, for example, half of the maximum applied voltage of circuit 700. Subtractor 705 may produce a control signal that may be provided as feedback to slave oscillators 702 and/or 703. Based on the control signal, the free-running frequency of slave oscillators 702 and/or 703 may be tuned, modified and/or adjusted to more closely match the injected frequency, such that slave oscillators 702 and/or 703 may better acquire and/or lock onto the injected frequency.

Optionally, the control signal may pass through loop filter 706, which may be used to stabilize circuit 700, e.g., to prevent undesired residual frequency corrections after a desired tuned frequency has been reached. Loop filter 706 may include any suitable type of loop filter as is known in the art.

It is noted that in an exemplary embodiment, if the phase difference between the output signal of slave oscillator 702 and the output signal of slave oscillator 703 is $\pi/2$, then the control signal produced by subtractor 705 may be equal to zero, indicating that no further tuning is required.

Figure 8:
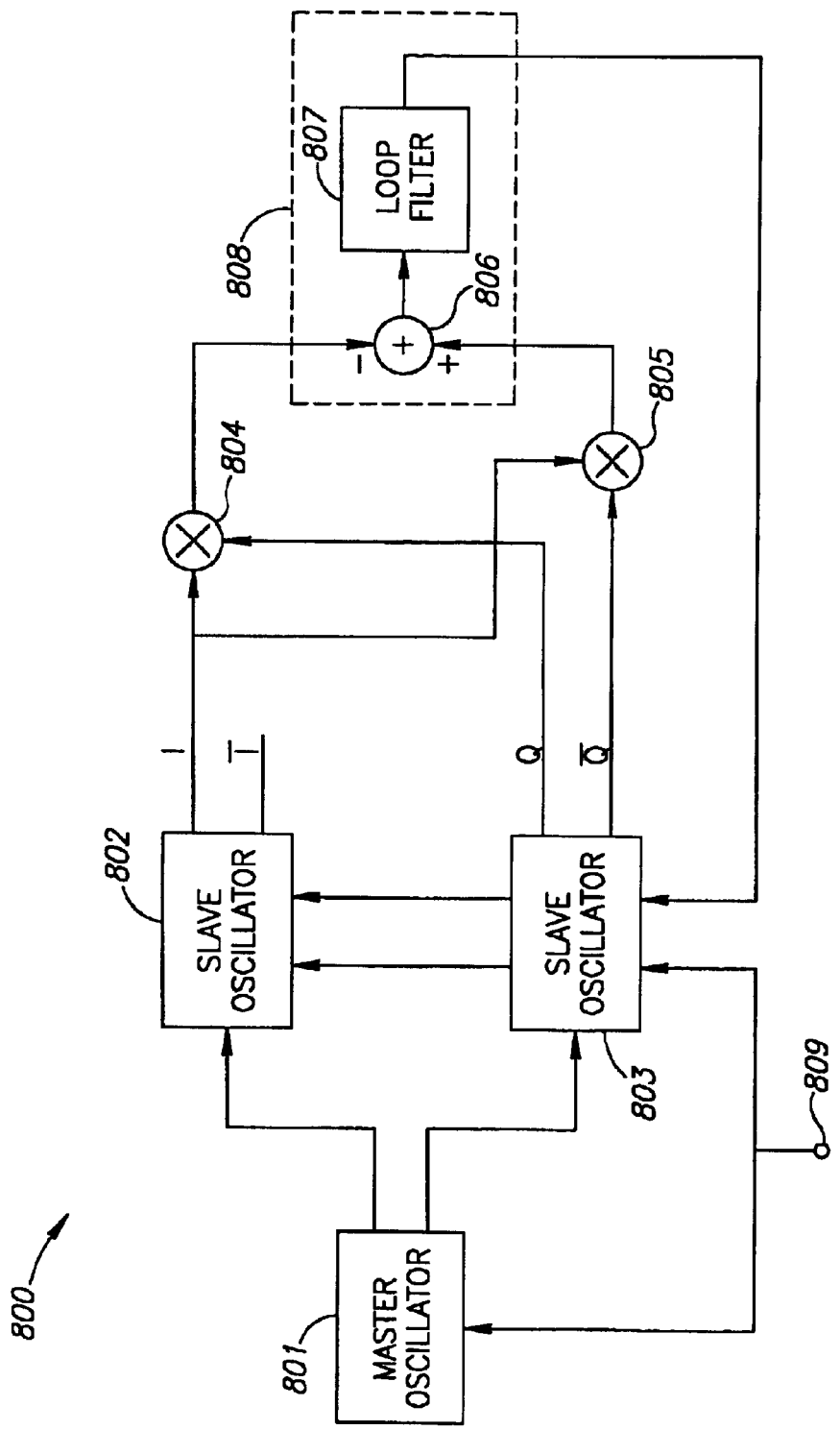
FIG. 8 is a schematic illustration of a tuning circuit with differential phase comparison in accordance with exemplary embodiments of the invention.

FIG. 8 schematically illustrates a tuning circuit 800 with differential phase comparison in accordance with an exemplary embodiment of the invention. Circuit 800 may include, for example, a master oscillator 801, two slave oscillators 802 and 803, two gates 804 and 805, a subtractor 806, a loop filter 807, and a tuning control 809. These components may be arranged and/or connected, for example, as illustrated schematically in FIG. 8.

Each of gates 804 and 805 may include, for example, an analog multiplexer or a XOR gate. Subtractor 806 may include, for example, a subtractor unit or an adder unit. In some embodiments, subtractor 806 and loop filter 807 may be implemented using one integrated unit 808.

During operation of circuit 800, master oscillator 801 may produce and/or provide a signal to each of slave oscillators 802 and 803. Tuning control 809 may be used to tune the frequencies of master oscillator 801, slave oscillator 802 and/or slave oscillator 803, for example, to bring the frequencies of slave oscillator 802 and/or slave oscillator 803 sufficiently close to the frequency of master oscillator 801, such that circuit 800 may have sufficient gain to allow locking.

Gate 804 may receive an in-phase (I) signal from slave oscillator 802 and a quadrature (Q) signal from slave oscillator 803. Gate 805 may receive the I signal from slave oscillator 802 and a complementary quadrature ("Q-bar") signal from slave oscillator 803. Thus, gates 804 and 805 may perform a differential comparison of the signals produced by slave oscillators 802 and 803. For example, at any given timer, if the comparison of I and Q at gate 804 produces a positive output, the comparison of I and Q-bar at gate 805 may produce a negative output of comparable amplitude.

Subtractor 806 may subtract the output of gate 804 from the output of gate 806, or vice versa, thus producing a control signal responsive to the results of the differential comparison. It will be appreciated that this configuration obviates the need to use a reference signal, as in the embodiment of FIG. 7 above; therefore, this configuration may be less susceptible to uncontrolled changes or inaccuracy in the oscillator circuit, for example, inaccuracy in a reference voltage being used.

The control signal may be provided as feedback to slave oscillators 802 and/or 803. Based on the control signal, the free-running frequency of slave oscillators 802 and/or 803 may be tuned, modified and/or adjusted to more closely match the injected frequency, such that slave oscillators 802 and/or 803 may better acquire and/or lock onto the injected frequency. Optionally, the control signal may pass through loop filter 807, which may be used to stabilize circuit 800, e.g., to prevent undesired residual frequency corrections after a desired tuned frequency has been reached, as described above. Loop filter 807 may include any suitable type of loop filter as is known in the art.

It is noted that in an exemplary embodiment, if the phase difference between the output signal of gate 804 and the output signal of gate 805 is substantially zero, then the control signal produced by subtractor 806 may be substantially equal to zero, indicating that no further tuning is required.

Figure 9:
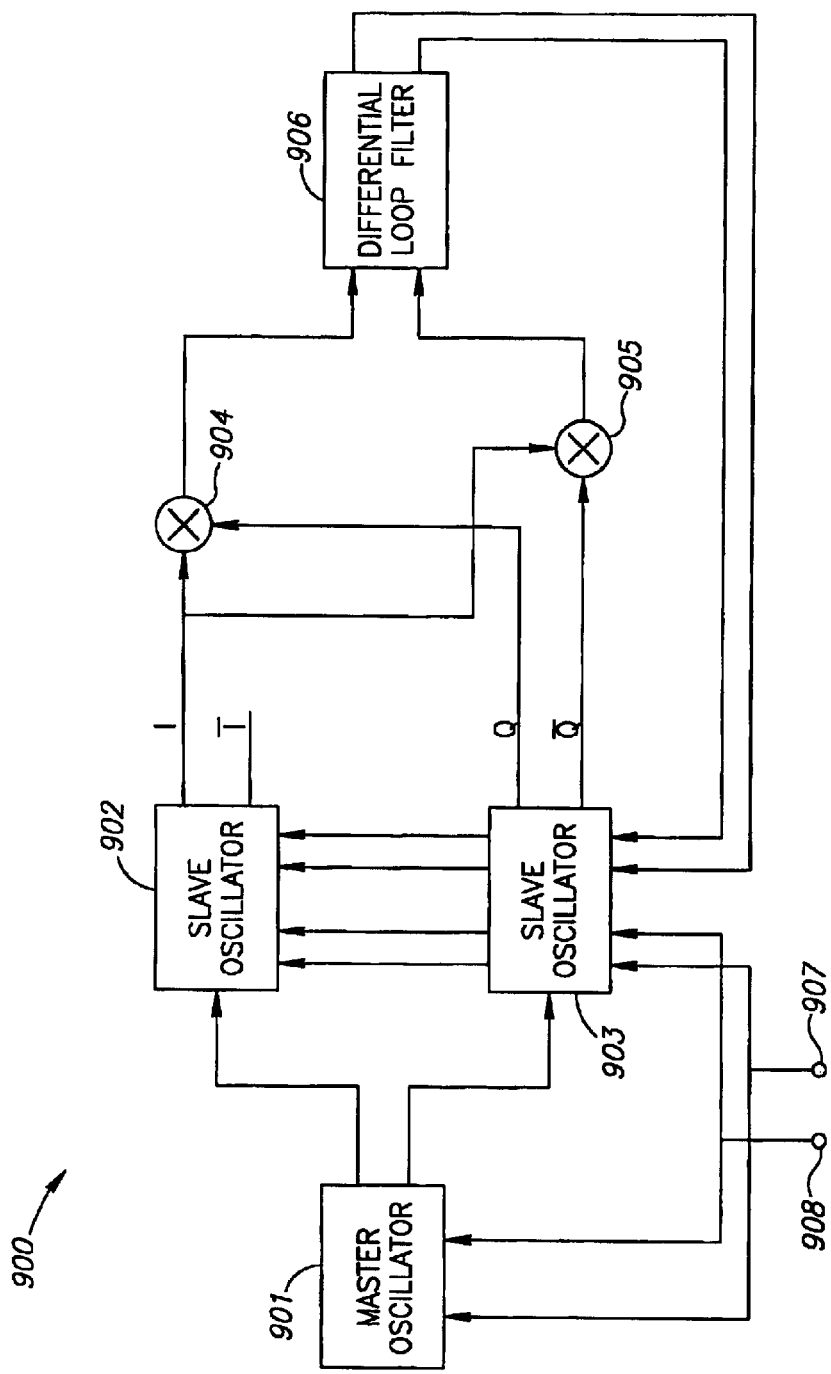
FIG. 9 is a schematic illustration of a tuning circuit with fully-differential tuning in accordance with exemplary embodiments of the invention.

FIG. 9 schematically illustrates a circuit 900 with fully-differential tuning in accordance with an exemplary embodiment of the invention. Circuit 900 may include, for example, a master oscillator 901, two slave oscillators 902 and 903, two gates 904 and 905, a differential loop filter 906, and two differential tuning controls 907 and 908. These components may be arranged and/or connected, for example, as illustrated schematically in FIG. 9.

Each of gates 904 and 905 may include, for example, an analog multiplexer or a XOR gate.

During operation of circuit 900, master oscillator 901 may produce and/or provide a signal to each of slave oscillators 902 and 903. Tuning controls 907 and 908 may be used to tune the frequencies of master oscillator 901, slave oscillator 902 and/or slave oscillator 903, for example, to bring frequencies of slave oscillator 902 and/or slave oscillator 903 sufficiently close to the frequency of master oscillator 901, such that circuit 900 may have sufficient gain to allow locking.

Gate 904 may receive an in-phase (I) signal from slave oscillator 902 and a quadrature (Q) signal from slave oscillator 903. Gate 904 may compare the phase difference of these two signals, and may produce a first control signal responsive to the comparison result.

Gate 905 may receive the I signal from slave oscillator 902 and a complementary quadrature ("Q-bar") signal from slave oscillator 903. Gate 905 may compare the phase difference of these two signals, and may produce a second control signal responsive to the comparison result.

The first and second control signals may be provided as feedback to slave oscillators 902 and/or 903. Based on the first and second control signals, the free-running frequency of slave oscillators 902 and/or 903 may be tuned, modified and/or adjusted to more closely match the injected frequency, such that slave oscillators 902 and/or 903 may better acquire and/or lock onto the injected frequency.

It will be appreciated that, in analogy to the configuration embodiment of FIG. 8, the configuration of FIG. 9 does not require use of a reference signal, thereby reducing the sensitivity of the oscillator circuit to uncontrolled changes or inaccuracies.

Optionally, the first and second control signals may pass through differential loop filter 906, which may be used to stabilize circuit 900, as described above with reference to the embodiments of FIGS. 7 and 8. Loop filter 906 may include any suitable type of loop filter as is known in the art.

It is noted that in an exemplary embodiment, the first control signal and the second control signal may cancel each other if the phase difference between the output of slave oscillator 902 and the output of slave oscillator 903 is $\pi/2$, and in such case no further tuning may be required.

In some embodiments, since circuit 900 may be fully differential, it may allow improved and/or more accurate and/or separate tuning and/or fine-tuning of slave oscillators 902 and/or 903.

Figure 10:
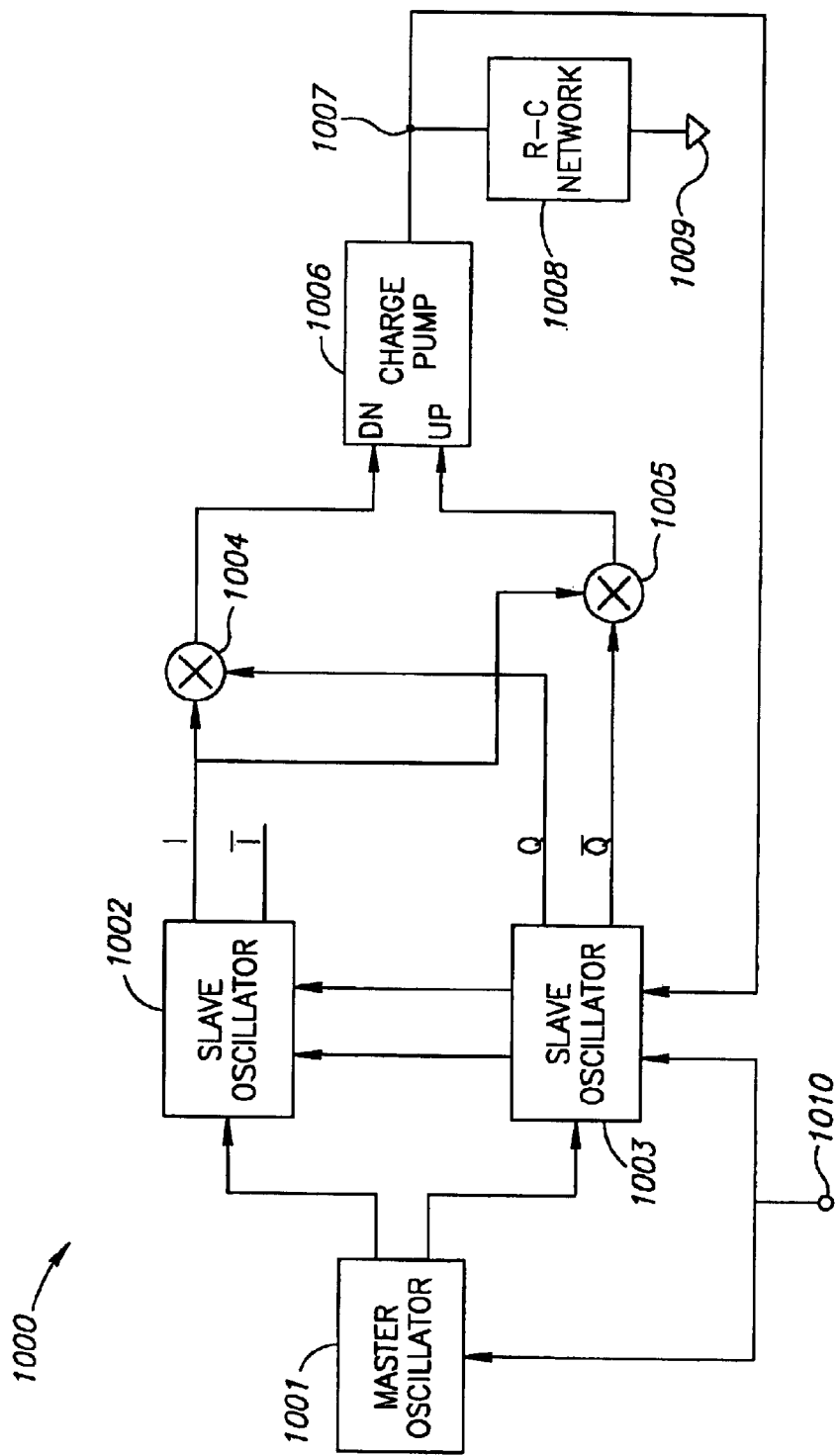
FIG. 10 is a schematic illustration of a tuning circuit with a charge-pump lock filter in accordance with exemplary embodiments of the invention.

FIG. 10 schematically illustrates a tuning circuit 1000 with charge-pump lock-filter in accordance with an exemplary embodiment of the invention. Circuit 1000 may include, for example, a master oscillator 1001, two slave oscillators 1002 and 1003, two gates 1004 and 1005, a charge-pump 1006, a Resistor Capacitor (RC) network 1008, and a tuning control 1010. These components may be arranged and/or connected, for example, as illustrated schematically in FIG. 10, and such that RC network 1008 may be connected between node 1007 and ground 1009.

Each of gates 1004 and 1005 may include, for example, an analog multiplexer or a XOR gate.

During operation of circuit 1000, master oscillator 1001 may produce and/or provide a signal to each of slave oscillators 1002 and 1003. Tuning control 1010 may be used to tune the frequencies of master oscillator 1001, slave oscillator 1002 and/or slave oscillator 1003, for example, to bring frequencies of slave oscillator 1002 and/or slave oscillator 1003 sufficiently close to the frequency of master oscillator 1001, such that circuit 1000 may have sufficient gain to allow locking.

Gate 1004 may receive an in-phase (I) signal from slave oscillator 1002 and a quadrature (Q) signal from slave oscillator 1003. Gate 1005 may receive the I signal from slave oscillator 1002 and a complementary quadrature ("Q-bar") signal from slave oscillator 1003. Gates 1004 and 1005 may perform a differential comparison of their input signals, and produce a control signal responsive to the comparison result. The control signal may be provided as feedback to slave oscillators 1002 and/or 1003. Based on the control signal, the free-running frequency of slave oscillators 1002 and/or 1003 may be tuned, modified and/or adjusted to more closely match the injected frequency, such that slave oscillators 1002 and/or 1003 may better acquire and/or lock onto the injected frequency.

Optionally, charge-pump 1006 and/or RC network 1008 may provide loop-filter functionality, e.g., charge-pump 1006 and/or RC network 1008 may be used to stabilize circuit 1000, e.g., to prevent undesired residual frequency corrections after a desired tuned frequency has been reached.

It is noted that in an exemplary embodiment, if the phase difference between the output signal of gate 1004 and the output signal of gate 1005 is zero, then the control signal provided as feedback may be equal to zero, indicating that no further tuning is required.

In the exemplary circuits of FIGS. 7 to 10, and/or in other embodiments of the invention, a suitable combination of an Exclusive OR (XOR) gate and/or an Exclusive Not OR (XNOR) gate may be used, for example, to obtain a differential tuning voltage, or to render the tuning voltage insensitive or less sensitive to offsets.

In the exemplary circuits of FIGS. 7 to 10, and/or in other embodiments of the invention, two multipliers may be used: a first multiplier to obtain a differential tuning signal, and a second multiplier to compare phases of an in-phase (I) signal and the complement component ("Q-bar") of a quadrature signal.

Figure 11:
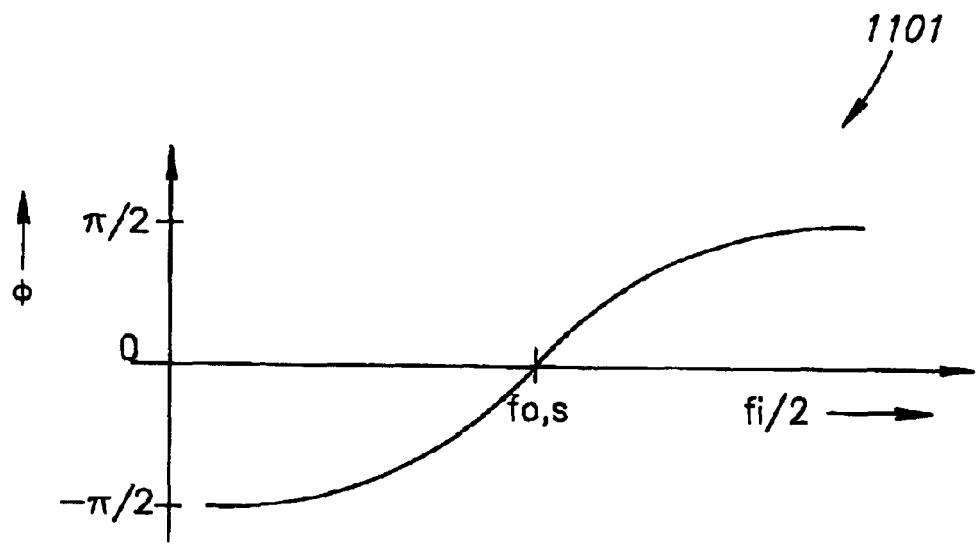
FIG. 11 is a schematic illustration of a graph depicting phase difference between the input and output of a slave oscillator as a function of frequency, demonstrating another aspect of exemplary embodiments of the invention.

FIG. 11 schematically illustrates a graph 1101 depicting phase of a slave oscillator as a function of injected frequency, useful in demonstrating additional aspects of embodiments of the invention.

In accordance with an additional aspect of exemplary embodiments of the invention,sa monotonic relationship between the injected frequency and the output phase of a slave oscillator, as conceptually depicted in graph 1101 of FIG. 11, may be utilized to assess and/or correct a frequency offset between the free-running frequency of the slave oscillator and the injected frequency injected to the slave oscillator.

In some embodiments, the frequency of the input signal may be at the second harmonic of the frequency of the output signal. A phase difference between two signals may be defined if the two signals are at the same frequency; however, accordance with an exemplary embodiment of the invention, harmonic relation may further allow defining a phase difference related to the time delay between zero-crossings. It may be observed that if the input signal is given by $\mathrm{Sin}(2\omega_0 t)$, then the in-phase signal may be expressed as $\mathrm{Sin}(\omega_0 t + \mathrm{Phi})$. Thus, alternate zero-crossings of the input signal may lag the corresponding zero-crossings of the output by a delay proportional to Phi. In some embodiments, Phi may be a function of the difference between half the frequency of the input signal and the free-running frequency of the slave oscillator. Phi may vary in the range $(-\pi/2, \pi/2)$ as illustrated schematically in graph 1101. Phi may intersect zero when the free-running frequency of the slave oscillator is at half the input frequency. Thus, Phi may be a measure of the frequency offset. In accordance with an exemplary embodiment of the invention, a circuit may produce an output proportional to Phi, and such circuit may be used in a feedback loop to drive Phi to zero and thus achieve frequency centering.

Figure 12:
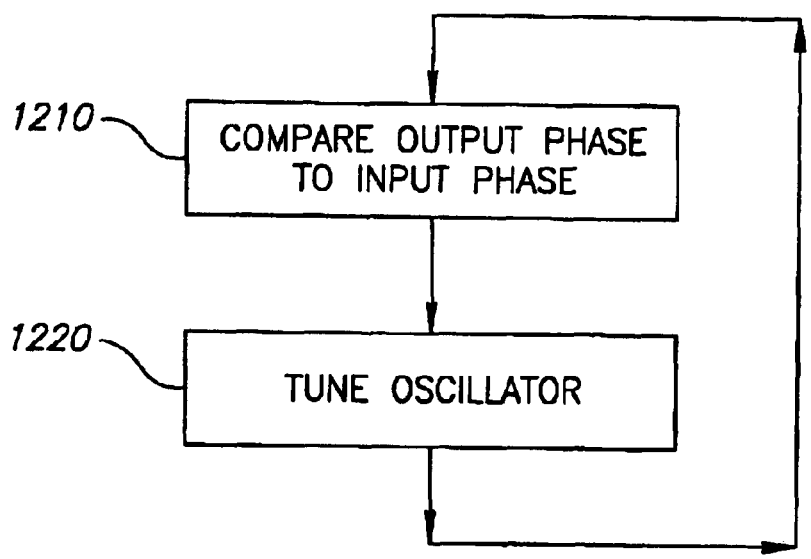
FIG. 12 is a flow chart diagram of a method of tuning a slave oscillator in accordance with an exemplary embodiment of the invention.

FIG. 12 schematically illustrates a flow chart of a method of tuning a slave oscillator in accordance with an exemplary embodiment of the invention. The method of FIG. 12 may be used, for example, with the exemplary circuits of FIGS. 13 to 17, and/or other suitable circuits in accordance with embodiments of the invention.

As indicated at block 1210, an output phase of a slave oscillator may be compared to an input phase of the slave oscillator. In some embodiments, the input phase of a slave oscillator may be equal to an output phase of a master oscillator, and the comparison may be performed between the output phase of the slave oscillator and the output phase of the master oscillator. In an exemplary embodiment, a value of a property indicating the output phase of the slave oscillator may be compared to a value of a parameter indicating the input phase of the slave oscillator.

In some embodiments, before comparison, the compared signals may optionally be divided down by a pre-determined factor or value to a low frequency at which the comparison is made. For example, if the slave oscillator output signal is divided by N, then the master oscillator output signal may be divided by 2N. Such division may allow, for example, a more accurate comparison, and/or the use of a wider variety of comparison or detection components for the comparison operations. In some embodiments, the division index should not be too high, since frequency division may reduce the range of phase variation; yet the division index should be sufficient to operate a comparison unit or a detector unit.

As indicated at block 1220, the frequency of the slave oscillator may be tuned, adjusted and/or modified, for example, in relation to the comparison results or based on a control signal responsive to the comparison. In some embodiments, such tuning, adjustment and/or modification may be performed smoothly, repeatedly, continuously and/or substantially continuously.

In some embodiments, the method of FIG. 12 may allow better locking and/or better acquisition of an injected master frequency by the slave oscillator. It is noted that other operations and/or methods in accordance with embodiments of the invention may be used in conjunction with the circuits of FIGS. 13 to 17, as well as with other analog, digital, single-ended or differential circuits in accordance with embodiments of the invention.

Figure 13:
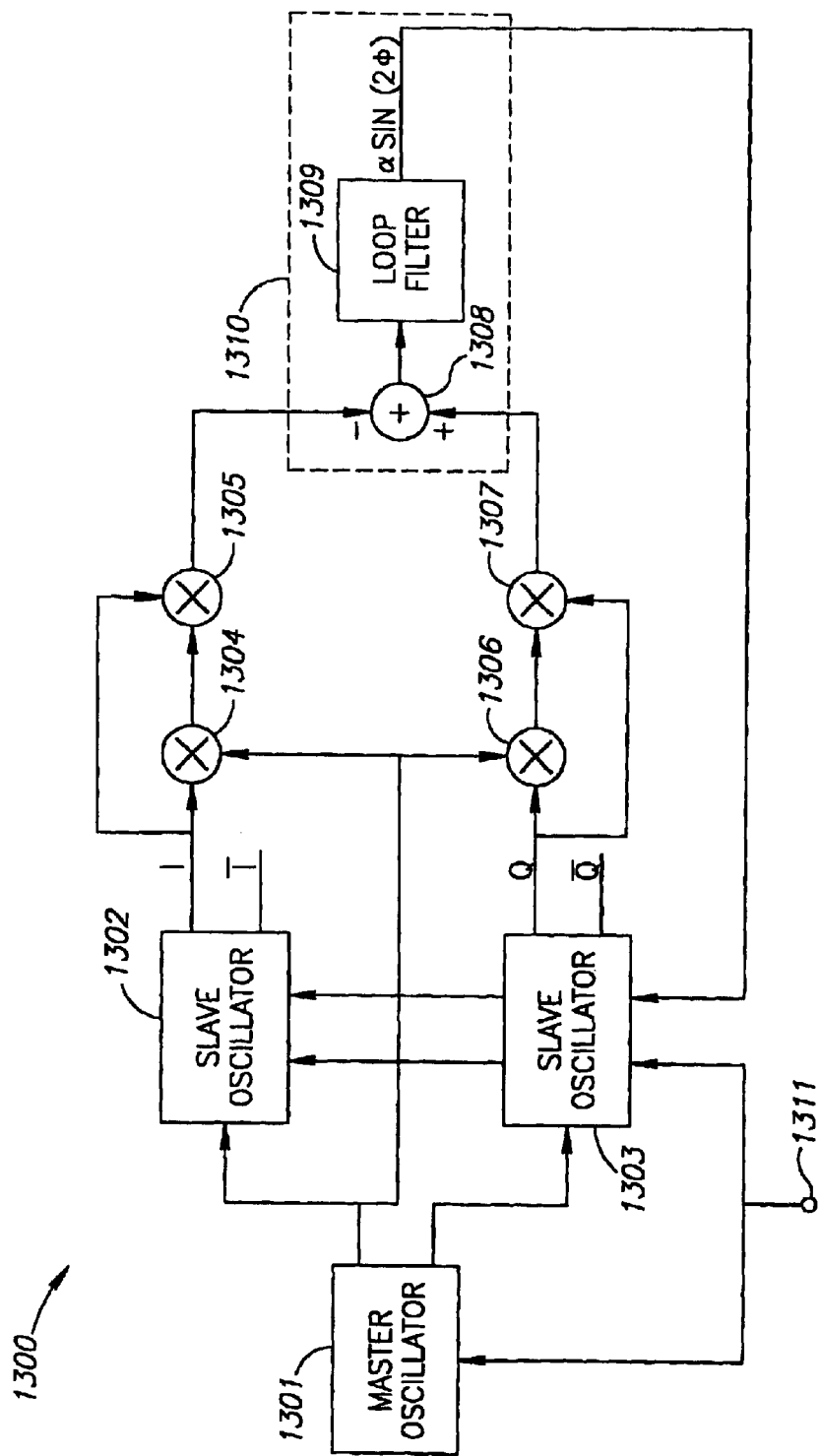
FIG. 13 is a schematic illustration of a single-ended tuning circuit in accordance with additional exemplary embodiments of the invention.

FIG. 13 schematically illustrates a single-ended tuning circuit 1300 in accordance with an exemplary embodiment of the invention. Circuit 1300 may include, for example, a master oscillator 1301, two slave oscillators 1302 and 1303, four gates 1304, 1305, 1306 and 1307, a subtractor 1308, a loop filter 1309, and a tuning control 1311.

Each of gates 1304, 1305, 1306 and 1307 may include, for example, an analog multiplexer or a XOR gate. Subtractor 1308 may include, for example, a subtractor unit or an adder unit, in accordance with specific implementations. In some embodiments, subtractor 1308 and loop filter 1309 may be implemented using one integrated unit 1310.

During operation of circuit 1300, master oscillator 1301 may produce and/or provide a master signal to each of slave oscillators 1302 and 1303. Tuning control 1311 may be used to tune the frequencies of master oscillator 1301, slave oscillator 1302 and/or slave oscillator 1303, for example, to bring frequencies of slave oscillator 1302 and/or slave oscillator 1303 sufficiently close to the frequency of master oscillator 1301, such that circuit 1300 may have sufficient gain to allow locking. It is noted that locking may be performed, for example, using devices, circuits, sub-circuits, components and/or methods as described in detail above with reference to FIGS. 2–10.

Gates 1304 and 1305 may receive an in-phase (I) signal from slave oscillator 1302 and a master signal from master oscillator 1301. Gates 1304 and 1305 may compare the phase difference of these signals, and may produce a first output signal responsive to the comparison result.

Similarly, gates 1306 and 1307 may receive a quadrature (Q) signal from slave oscillator 1303 and the master signal from master oscillator 1301. Gates 1306 and 1307 may compare the phase difference of these signals, and may produce a second output signal responsive to the comparison result.

Subtractor 1308 may subtract the first output signal from the second output signal, or vice versa, producing a control signal that may be provided as feedback to slave oscillators 1302 and/or 1303. Optionally, the control signal may pass through loop filter 1309, which may improve stabilization of circuit 1300. Based on the control signal, the free-running frequency of slave oscillators 1302 and/or 1303 may be tuned, modified and/or adjusted to more closely match the injected frequency, such that slave oscillators 1302 and/or 1303 may better and/or more accurately and/or more efficiently resonate at the injected frequency.

Optionally, the control signal may pass through loop filter 1309, which may be used to stabilize circuit 1300, e.g., to prevent undesired residual frequency corrections after a desired tuned frequency has been reached. Loop filter 1309 may include any suitable type of loop filter as is known in the art.

It is noted that in an exemplary embodiment, if the output frequencies of slave oscillators 1302 and/or 1303 are equal to the master frequency of master oscillator 1301, then the control signal produced by subtractor 1308 may be equal to zero, indicating that no further tuning is required. It is further noted that the output frequency of circuit 1300 may be proportional to Sin(2*Phi), wherein Phi represents phase difference, as described above with reference to FIG. 11.

Figure 14:
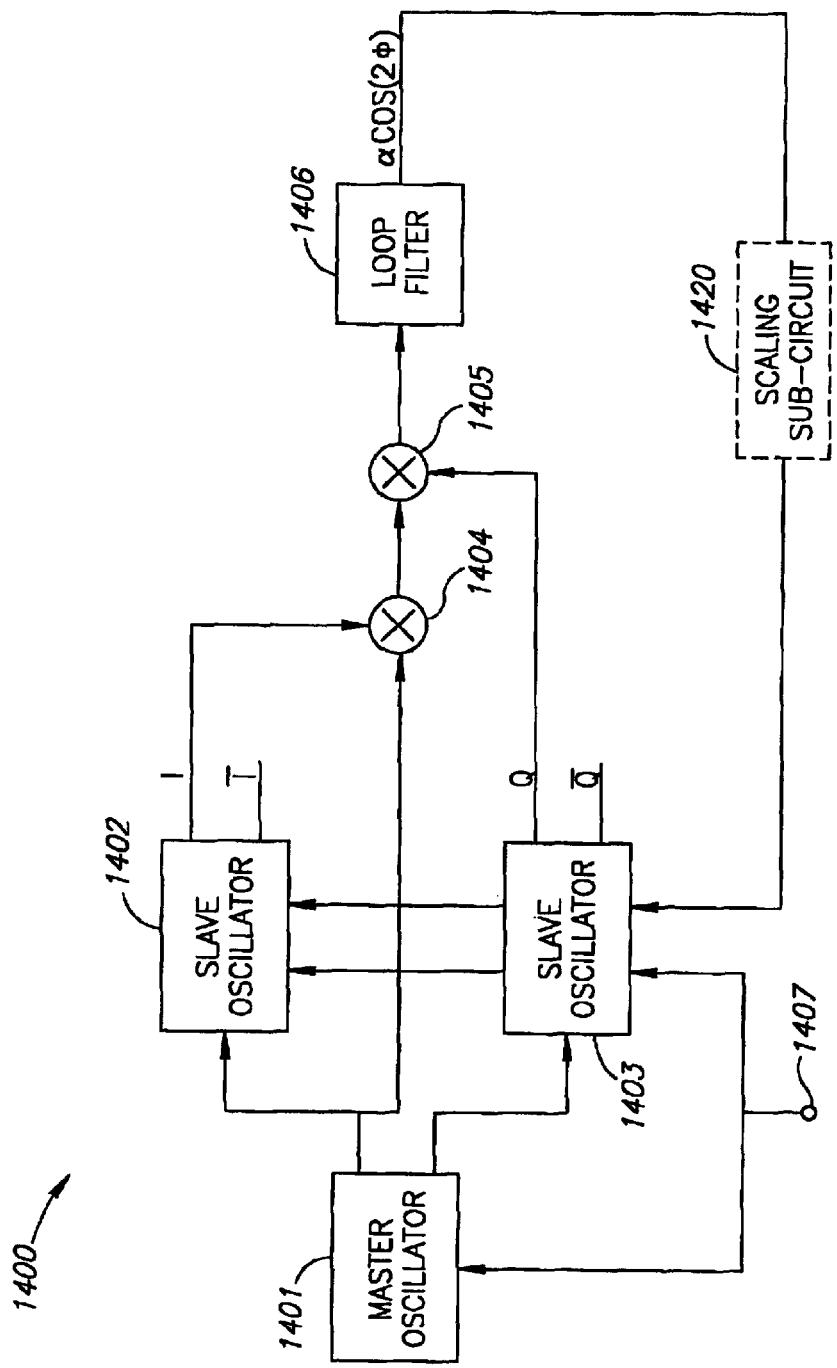
FIG. 14 is a schematic illustration of another single-ended tuning circuit in accordance with further exemplary embodiments of the invention.

FIG. 14 schematically illustrates another single-ended tuning circuit 1400 in accordance with an exemplary embodiment of the invention. Circuit 1400 may include, for example, a master oscillator 1401, two slave oscillators 1402 and 1403, two gates 1404 and 1405, a loop filter 1406, a tuning control 1407, and an optional scaling sub-circuit 1420. These components may be arranged and/or connected, for example, as illustrated schematically in FIG. 14.

Each of gates 1404 and 1405 may include, for example, an analog multiplexer or a XOR gate.

During operation of circuit 1400, master oscillator 1401 may produce and/or provide a signal to each of slave oscillators 1402 and 1403. Tuning control 1407 may be used to tune the frequencies of master oscillator 1401, slave oscillator 1402 and/or slave oscillator 1403, for example, to bring frequencies of slave oscillator 1402 and/or slave oscillator 1403 sufficiently close to the frequency of master oscillator 1401, such that circuit 1400 may have sufficient gain to allow locking. It is noted that locking may be performed, for example, using devices, circuits, sub-circuits, components and/or methods as described in detail above with reference to FIGS. 2 to 10.

Gates 1404 may compare the phase difference of an in-phase (I) signal from slave oscillator 1402 and a master signal from master oscillator 1401. Gate 1405 may compare the phase difference of the output signal of gate 1404 and a quadrature (Q) signal from slave oscillator 1403. Gate 1405 may produce a control signal responsive to the comparisons result. The control signal may be provided as feedback to slave oscillators 1402 and/or 1403.

Optionally, the control signal may pass through loop filter 1406, which may be used to stabilize circuit 1400, e.g., to prevent undesired residual frequency corrections after a desired tuned frequency has been reached. Loop filter 1406 may include any suitable type of loop filter as is known in the art.

Optionally, the control signal may pass through scaling sub-circuit 1420, which may scale the amplitude of the control signal to allow more accurate tuning of slave oscillators 1402 and/or 1403.

Based on the control signal, the free-running frequency of slave oscillators 1402 and/or 1403 may be tuned, modified and/or adjusted to more closely match the injected frequency, such that slave oscillators 1402 and/or 1403 may better and/or more accurately and/or more efficiently resonate at the injected frequency.

It is noted that in an exemplary embodiment, if the output frequencies of slave oscillators 1402 and/or 1403 are equal to the master frequency of master oscillator 1401, then the control signal produced by gates 1404 and 1405 may be equal to zero, indicating that no further tuning is required. It is further noted that the output frequency of circuit 1400 may be proportional to Cos(2*Phi), wherein Phi represents phase difference, as described above with reference to FIG. 11.

Figure 15:
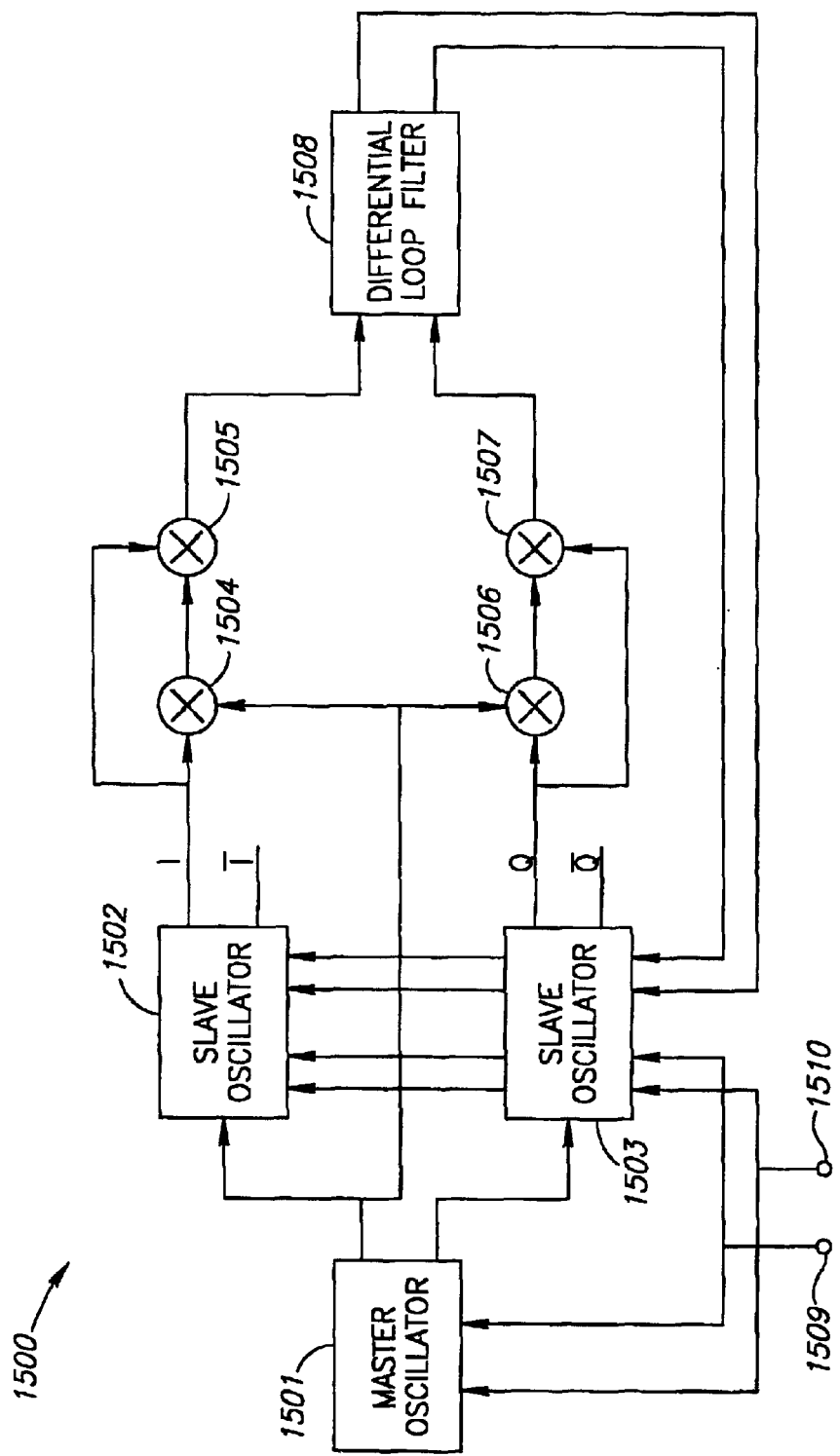
FIG. 15 is a schematic illustration of a circuit with fully-differential tuning in accordance with exemplary embodiments of the invention.

FIG. 15 schematically illustrates a circuit 1500 with fully-differential tuning in accordance with an exemplary embodiment of the invention. Circuit 1500 may include, for example, a master oscillator 1501, two slave oscillators 1502 and 1503, four gates 1504, 1505, 1506, and 1507, a differential loop filter 1508, and two differential tuning controls 1509 and 1510. These components may be arranged and/or connected, for example, as illustrated schematically in FIG. 15.

During operation of circuit 1500, master oscillator 1501 may produce and/or provide a signal to each of slave oscillators 1502 and 1503. Tuning controls 1509 and 1510 may be used to tune the frequencies of master oscillator 1501, slave oscillator 1502 and/or slave oscillator 1503, for example, to bring frequencies of slave oscillator 1502 and/or slave oscillator 1503 sufficiently close to the frequency of master oscillator 1501, such that circuit 1500 may have sufficient gain to allow locking. It is noted that locking may be performed, for example, using devices, circuits, sub-circuits, components and/or methods as described in detail above with reference to FIGS. 2–10.

Gates 1504 and 1505 may receive an in-phase (I) signal from slave oscillator 1502 and a master signal from master oscillator 1501. Gates 1504 and 1505 may compare the phase difference of these signals, and may produce a first control signal responsive to the comparison result.

Similarly, gates 1506 and 1507 may receive a quadrature (Q) signal from slave oscillator 1503 and a master signal from master oscillator 1501. Gates 1506 and 1507 may compare the phase difference of these signals, and may produce a second control signal responsive to the comparison result.

The first and second control signals may be provided as feedback to slave oscillators 1502 and/or 1503. Based on the first and second control signals, the free-running frequency of slave oscillators 1502 and/or 1503 may be tuned, modified and/or adjusted to more closely match the injected frequency, such that slave oscillators 1502 and/or 1503 may better and/or more accurately and/or more efficiently resonate at the injected frequency.

Optionally, the first and second control signals may pass through differential loop filter 1508, which may be used to stabilize circuit 1500, e.g., to prevent undesired residual frequency corrections after a desired tuned frequency has been reached. Loop filter 1508 may include any suitable type of loop filter as is known in the art.

It is noted that in an exemplary embodiment, the first control signal and the second control signal may cancel each other if the frequency of the output signals of slave oscillators 1502 and/or 1503 are equal to the frequency of the master signal of master oscillator 1501 and, in such case, no further tuning may be required.

In some embodiments, since circuit 1500 may be fully differential, it may allow improved and/or more accurate and/or separate tuning and/or fine-tuning of slave oscillators 1502 and/or 1503.

Figure 16:
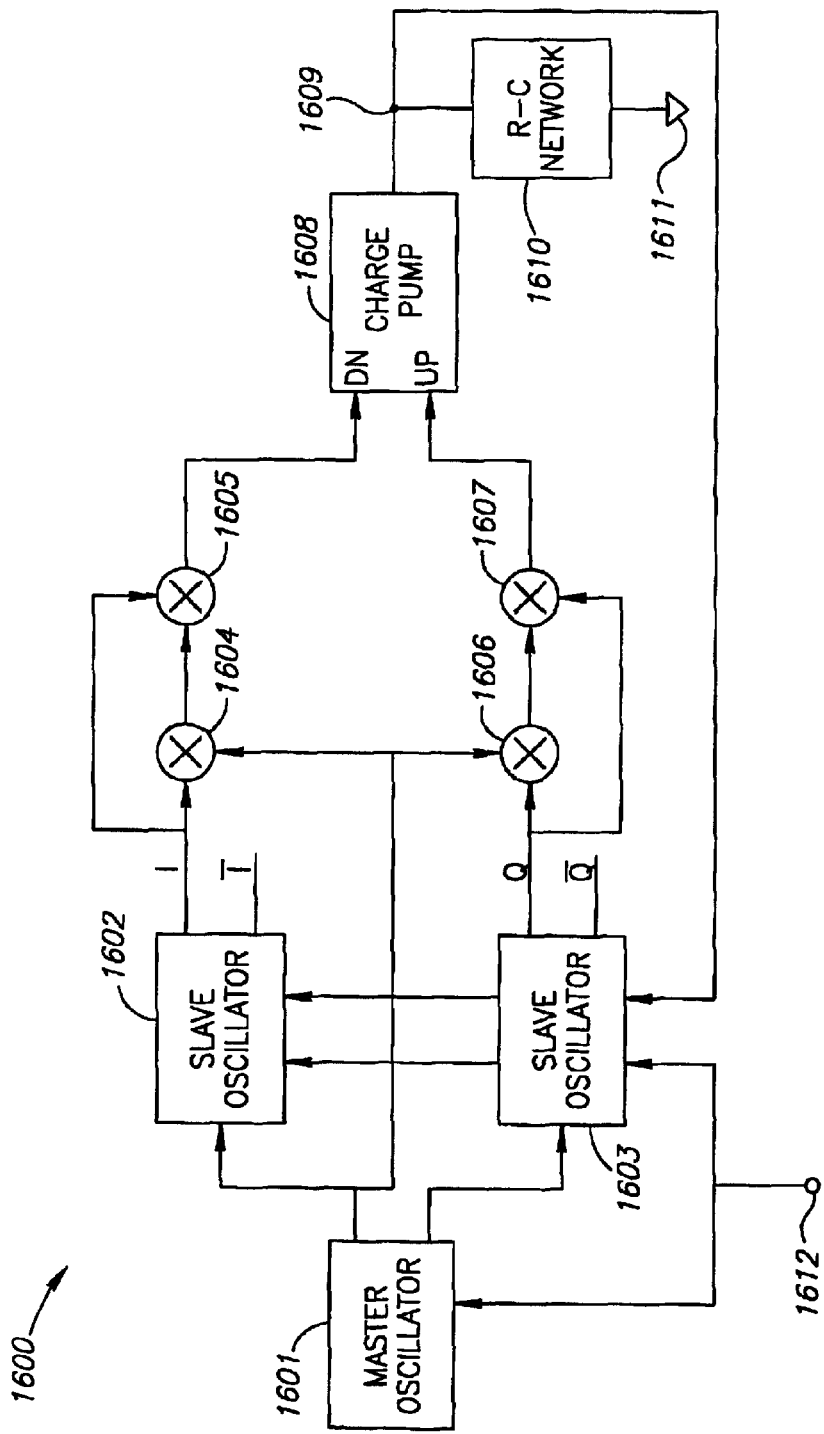
FIG. 16 is a schematic illustration of a tuning circuit using a charge-pump lock-filter in accordance with exemplary embodiments of the invention.

FIG. 16 schematically illustrates a tuning circuit 1600 with a charge-pump lock-filter in accordance with an exemplary embodiment of the invention. Circuit 1600 may include, for example, a master oscillator 1601, two slave oscillators 1602 and 1603, four gates 1604, 1605, 1606 and 1607, a charge-pump 1608, a Resistor Capacitor (RC) network 1610, and a tuning control 1612. These components may be arranged and/or connected, for example, as illustrated schematically in FIG. 16, and such that RC network 1610 may be connected between node 1609 and ground 1611.

During operation of circuit 1600, master oscillator 1601 may produce and/or provide a signal to each of slave oscillators 1602 and 1603. Tuning control 1612 may be used to tune the frequencies of master oscillator 1601, slave oscillator 1602 and/or slave oscillator 1603, for example, to bring frequencies of slave oscillator 1602 and/or slave oscillator 1603 sufficiently close to the frequency of master oscillator 1601, such that circuit 1600 may have sufficient gain to allow locking. It is noted that locking may be performed, for example, using devices, circuits, sub-circuits, components and/or methods as described in detail above with reference to FIGS. 2–10.

Gates 1604 and 1605 may receive an in-phase (I) signal from slave oscillator 1602 and an output signal from master oscillator 1601. Gates 1604 and 1605 may compare the phase difference of these signals. Similarly, gates 1606 and 1607 may receive a quadrature (Q) signal from slave oscillator 1603 and an output signal from master oscillator 1601. Gates 1606 and 1607 may compare the phase difference of these signals. Gates 1604, 1605, 1606 and 1607 may produce a control signal responsive to the comparisons results.

The control signal may be provided as feedback to slave oscillators 1602 and/or 1603. Based on the control signal, the free-running frequency of slave oscillators 1602 and/or 1603 may be tuned, modified and/or adjusted to more closely match the injected frequency, such that slave oscillators 1602 and/or 1603 may better and/or more accurately and/or more efficiently resonate at the injected frequency.

Optionally, charge-pump 1608 and RC network 1610 may be used as an exemplary implementation of a loop filter to stabilize circuit 1600, e.g., to prevent undesired residual frequency corrections after a desired tuned frequency has been reached.

It is noted that in an exemplary embodiment, the control signal may be equal to zero if the frequency of the output signal of slave oscillators 1602 and/or 1603 is equal to the frequency of the output signal of master oscillator 1601, and in such case no further tuning may be required.

Figure 17:
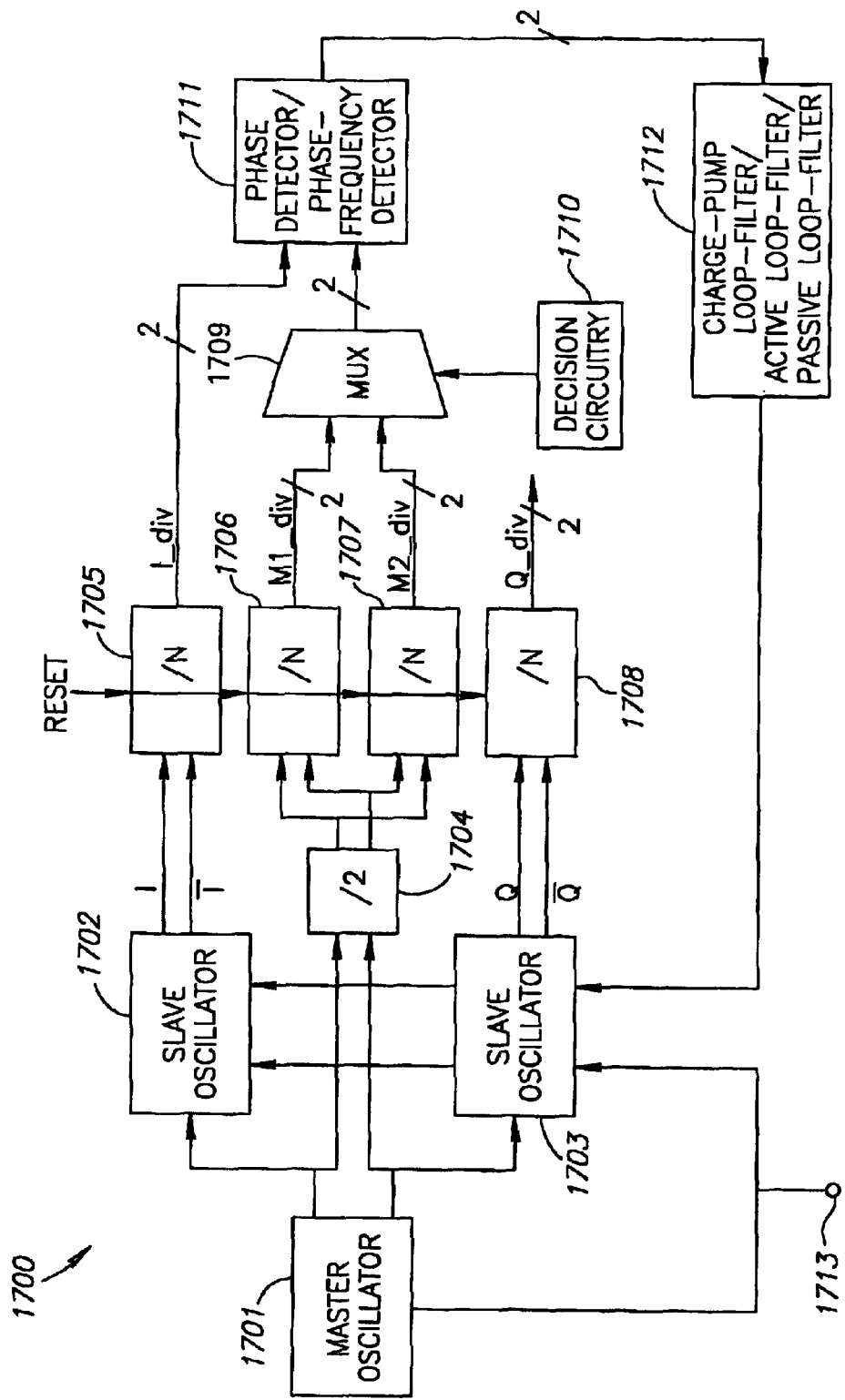
FIG. 17 is a schematic illustration of a digital tuning circuit in accordance with exemplary embodiments of the invention.

FIG. 17 schematically illustrates a digital tuning circuit 1700 in accordance with an exemplary embodiment of the invention. Circuit 1700 may include a master oscillator 1701, two slave oscillators 1702 and 1703, a divider 1704, resettable dividers 1705, 1706, 1707 and 1708, a multiplexer 1709, a decision circuitry 1710, a detector 1711, a filter 1712, and a tuning control 1713. These components may be arranged and/or connected, for example, as illustrated schematically in FIG. 17.

Detector 1711 may include, for example, a phase detector or a phase-frequency detector. Filter 1712 may include, for example, a charge-pump loop filter, an active loop filter, or a passive loop filter.

Figure 18:
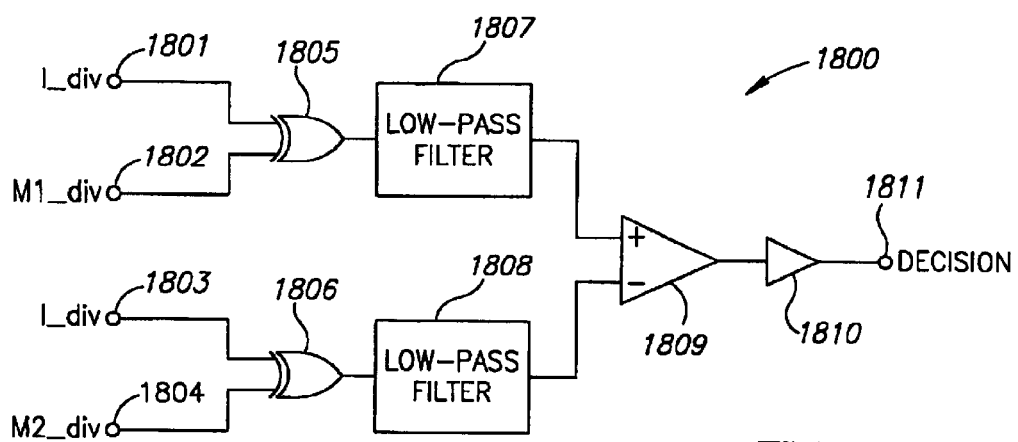
FIG. 18 is a schematic illustration of a decision and multiplexing sub-circuit that may be used in the tuning circuit of FIG. 17.

Reference is now made also to FIG. 18, which schematically illustrates a decision circuit 1800 in accordance with an exemplary embodiment of the invention. In some embodiments, at least parts of multiplexer 1709, decision circuitry 1710 and detector 1711 may be implemented, for example, in the form of decision circuit 1800.

Decision circuit 1800 may include, for example, four nodes 1801, 1802, 1803 and 1804, a XOR gate 1805, a XOR gate 1806, a low-pass filter 1807, a low-pass filter 1808, an adder 1809, a buffer 1810, and an output node 1811. These components may be arranged and/or connected, for example, as illustrated schematically in FIG. 18.

During operation of circuit 1700, master oscillator 1701 may produce and/or provide a signal to each of slave oscillators 1702 and 1703. Tuning control 1713 may be used to tune the frequencies of master oscillator 1701, slave oscillator 1702 and/or slave oscillator 1703, for example, to bring frequencies of slave oscillator 1702 and/or slave oscillator 1703 sufficiently close to the frequency of master oscillator 1701, such that circuit 1700 may have sufficient gain to allow locking. It is noted that locking may be performed, for example, using devices, circuits, sub-circuits, components and/or methods as described in detail above with reference to FIGS. 2 to 10.

Detector 1711 may receive two input signals. The first input signal may include an in-phase output signal of slave oscillator 1702, which frequency has been divided by N using divider 1705. The second input signal may include an output signal of master oscillator 1701, which frequency has been divided by 2N; such division may be performed, for example, using divider 1704 to perform division by 2, and divider 1706 or divider 1707 to perform further division by N.

In some embodiments, master oscillator 1701 may produce two output signals, M1 and M2, respectively, which frequencies may be divided by 2N to produce two divided signals, M1-div and M2-div, respectively. Multiplexer 1709 and decision circuitry 1710 may be used, for example, to select the stronger signal between M1-div and M2-div, or to select one of these two signals according to other predefined criteria, e.g., based on a relatively lower phase-error.

In an exemplary embodiment, a phase-error between an in-phase output signal of slave oscillator 1702 and M1-div signal may be compared to a phase-error between the in-phase output signal of slave oscillator 1702 and M2-div signal. Such comparison may be performed, for example, using decision circuit 1800 of FIG. 18.

Figure 19:
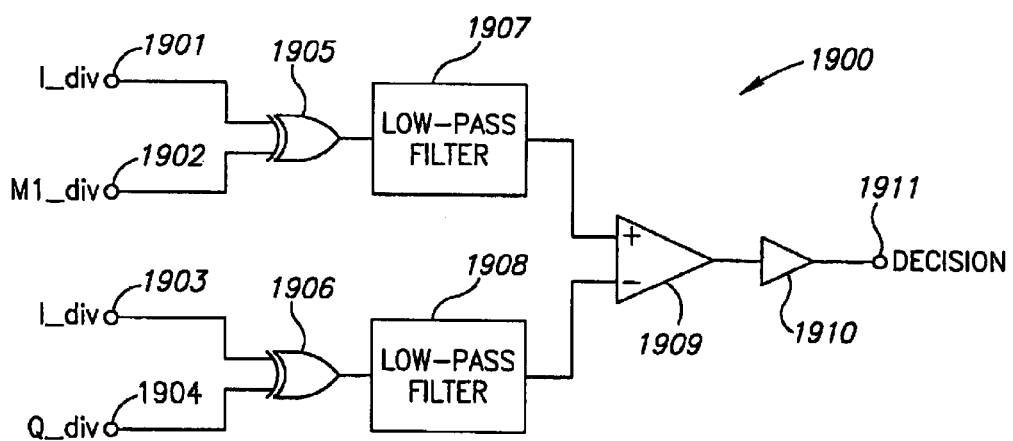
FIG. 19 is a schematic illustration of a decision and multiplexing sub-circuit that may be used in a tuning circuit similar to the tuning circuit of FIG. 17.

Reference is now made also to FIG. 19, which schematically illustrates an alternate embodiment of a decision circuit 1900 in accordance with an exemplary embodiment of the invention. In an alternate embodiment to the embodiment of FIG. 17, at least parts of a multiplexer, decision circuitry and a detector may be implemented, for example, in the form of decision circuit 1900.

Decision circuit 1900 may include, for example, four nodes 1901, 1902, 1903 and 1904, a XOR gate 1905, a XOR gate 1906, a low-pass filter 1907, a low-pass filter 1908, an adder 1909, a buffer 1910, and an output node 1911. These components may be arranged and/or connected, for example, as illustrated schematically in FIG. 19.

In an alternate embodiment to the embodiment of FIG. 17 and incorporating decision circuit 1900, a phase-error between an in-phase output signal of slave oscillator 1702 and M1-div signal may be compared to a phase-error between an in-phase output signal of slave oscillator 1702 and a quadrature output signal of slave oscillator 1703. Such comparison may be performed, for example, using decision circuit 1900.

It is noted that the comparisons described above with reference to FIGS. 18 and 19 may be performed even when slave oscillators 1702 and/or 1703 are not injection-locked, since in such case Phi may become a time-varying quantity and each of the comparisons may be valid.

Detector 1711 may compare the phase difference of its first and second input signals, and may produce a control signal responsive to the comparison result. The control signal may be provided as feedback to slave oscillators 1702 and/or 1703.

Based on the control signal, the free-running frequency of slave oscillators 1702 and/or 1703 may be tuned, modified and/or adjusted to more closely match the injected frequency, such that slave oscillators 1702 and/or 1703 may better and/or more accurately and/or more efficiently resonate at the injected frequency.

Optionally, the control signal may pass through filter 1712, which may be used to stabilize circuit 1700, e.g., to prevent undesired residual frequency corrections after a desired tuned frequency has been reached. Loop filter 1712 may include any suitable type of loop filter as is known in the art, for example, a charge-pump loop filter, an active loop filter, a passive loop filter, or other suitable loop filters.

It is noted that in an exemplary embodiment, some connections between components of circuit 1700 may include a plurality of wires and/or cables. For example, output signals from dividers 1705 to 1708, output signals from multiplexer 1709, and/or output signals from detector 1711, may be transferred over two wires to the next component in circuit 1700, respectively.

In some embodiments, dividers 1704 to 1708 may be implemented using digital dividers. This may be performed without degrading the quality of the signals and/or the tuning, for example, since the detection and/or comparison may be based on the frequency and/or phase of the signals and not necessarily on the information carried over the signals. It is noted that dividers 1704 to 1708 may be used, for example, to lower the frequency of the signals and/or to allow performing detection and/or comparison at low frequencies, which in turn may allow using a wider variety of detection and/or comparison components.

In some embodiments, phase ambiguities (e.g., between a phase of zero radians and a phase of $\pi$ radians) in the division operations may be avoided and/or reduced, for example, using resettable dividers 1705 to 1708 with a common reset signal and/or using multiple stage divisions (e.g., a first division chain to perform division by 2, and a second division chain, with the first division chain outputs flipped in polarity, to perform division by N). Other suitable methods, components and/or sub-circuits may be used to avoid and/or reduce phase ambiguities in a division process in accordance with embodiments of the invention.

In the circuits of FIGS. 13 to 17, to obtain better matching between the master oscillator and the two slave oscillators, a tunable resonator within a tank within a slave oscillator may be apportioned into two sections: a first section that may track the control voltage of the master oscillator, for example, set by a phase-lock loop for frequency stabilization; and a second section which may be controlled by the circuit.

In the circuits of FIGS. 13 to 17, the range of frequencies of the master oscillator may be fully covered by the tuning range of the slave oscillators. This may be achieved, for example, if the master oscillator signal is obtained from a similar oscillator structure, since parasitic components of the tank circuits may represent a smaller fraction of the resonant elements at half the frequency.

A circuit in accordance with an exemplary embodiment of the invention may be robust, e.g., the circuit may not be sensitive to variations due to manufacturing and/or against variations due to the potential presence of parasitic components in the tank circuits of the oscillators. The circuit may also compensate between any mismatch between the slave oscillators, and may be compatible with many single-ended differential oscillator tuning mechanisms.

It would be appreciated by persons skilled in the art that, exemplary embodiments of the invention may combine various functionalities and/or structures of various exemplary embodiments described above. For example, exemplary embodiments of the invention may combine functionalities and/or structures of one or more of the embodiments of FIGS. 1 to 4, of FIGS. 7 to 10, and/or of FIGS. 13 to 19.

Such a combination may combine, for example, improved locking functionalities enabled by the embodiments of FIGS. 7 to 10, with fine-tuning functionalities enabled by the embodiments of FIGS. 13 to 19.

Some embodiments of the invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors, or devices as are known in the art. Some embodiments of the invention may include buffers, registers, storage units and/or memory units, for temporary or long-term storage of data or in order to facilitate the operation of a specific embodiment.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. An apparatus comprising:
   a tuning circuit to tune a free-running frequency of at least one of a first slave oscillator, a second slave oscillator and a master oscillator, based on a comparison between a value responsive to a phase of an output of the first slave oscillator and a value responsive to a phase of an input from the master oscillator, said tuning circuit comprising:
      a first phase detector to produce a first output signal responsive to the phase-difference between the output of the first slave oscillator and the input from the master oscillator;
      a second phase detector to produce a second output signal responsive to the phase-difference between the output of the second slave oscillator and the input from the master oscillator; and
      a subtractor to subtract the voltage of said first output signal from said second output signal and to produce a control signal.

2. The apparatus of claim 1, comprising a loop filter to filter said control signal based on a pre-defined criterion.

3. An apparatus comprising:
   a tuning circuit to tune a free-running frequency of at least one of a first slave oscillator, a second slave oscillator and a master oscillator, based on a comparison between a value responsive to a phase of an output of the first slave oscillator and a value responsive to a phase of an input from the master oscillator, said tuning circuit comprising:
      a first phase detector to produce a first output signal responsive to the phase-difference between the output of the first slave oscillator and the input from the master oscillator; and
      a second phase detector to produce a second output signal responsive to the phase-difference between the output of the first phase detector and the output of the second slave oscillator and to produce a control signal.

4. A wireless communication device comprising:
   a dipole antenna to send and receive wireless signals; and
   a tuning circuit to tune a free-running frequency of at least one of a first slave oscillator, a second slave oscillator and a master oscillator, based on a comparison between a value responsive to a phase of an output of the first slave oscillator and a value responsive to a phase of an input from the master oscillator, said tuning circuit comprising:
      a first phase detector to produce a first output signal responsive to the phase-difference between the output of the first slave oscillator and the input from the master oscillator;
      a second phase detector to produce a second output signal responsive to the phase-difference between the output of the second slave oscillator and the input from the master oscillator; and
      a subtractor to subtract the voltage of said first output signal from said second output signal and to produce a control signal.

5. The wireless communication device of claim 4, comprising a loop filter to filter said control signal based on a pre-defined criterion.

6. A wireless communication device comprising:
   a dipole antenna to send and receive wireless signals; and
   a tuning circuit to tune a free-running frequency of at least one of a first slave oscillator, a second slave oscillator and a master oscillator, based on a comparison between a value responsive to a phase of an output of the first slave oscillator and a value responsive to a phase of an input from the master oscillator, said tuning circuit comprising:
      a first phase detector to produce a first output signal responsive to the phase-difference between the output of the first slave oscillator and the input from the master oscillator; and
      a second phase detector to produce a second output signal responsive to the phase-difference between the output of the first phase detector and the output of the second slave oscillator and to produce a control signal.

7. A communication system comprising:
   a first communication device able to communicate with a second communication device over a communication channel, the first communication device comprising:
      a tuning circuit to tune a free-running frequency of at least one of a first slave oscillator, a second slave oscillator and a master oscillator, based on a comparison between a value responsive to a phase of an output of the first slave oscillator and a value responsive to a phase of an input from the master oscillator, said tuning circuit comprising:
         a first phase detector to produce a first output signal responsive to the phase-difference between the output of the first slave oscillator and the input from the master oscillator;
         a second phase detector to produce a second output signal responsive to the phase-difference between the output of the second slave oscillator and the input from the master oscillator; and
         a subtractor to subtract the voltage of said first output signal from said second output signal and to produce a control signal.

8. The communication system of claim 7, wherein said tuning circuit comprises a loop filter to filter said control signal based on a pre-defined criterion.

9. A communication system comprising:
   a first communication device able to communicate with a second communication device over a communication channel, the first communication device comprising:
      a tuning circuit to tune a free-running frequency of at least one of a first slave oscillator, a second slave oscillator and a master oscillator, based on a comparison between a value responsive to a phase of an output of the first slave oscillator and a value responsive to a phase of an input from the master oscillator, said tuning circuit comprising:

a first phase detector to produce a first output signal responsive to the phase-difference between the output of the first slave oscillator and the input from the master oscillator; and a second phase detector to produce a second output signal responsive to the phase-difference between the output of the first phase detector and the output of the second slave oscillator and to produce a control signal.

* * * * *